United States Patent
Schneider et al.

(10) Patent No.: US 10,418,499 B2
(45) Date of Patent: Sep. 17, 2019

(54) SELF-ALIGNED NANOWIRE-BASED LIGHT EMITTING DIODE SUBPIXELS FOR A DIRECT VIEW DISPLAY AND METHOD OF MAKING THEREOF

(71) Applicant: GLO AB, Lund (SE)

(72) Inventors: Richard P. Schneider, Albuquerque, NM (US); Benjamin Leung, Sunnyvale, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 15/610,968

(22) Filed: Jun. 1, 2017

(65) Prior Publication Data

US 2018/0351017 A1 Dec. 6, 2018

(51) Int. Cl.
| | |
|---|---|
| *H01L 27/12* | (2006.01) |
| *H01L 27/15* | (2006.01) |
| *H01L 33/06* | (2010.01) |
| *H01L 33/18* | (2010.01) |
| *H01L 33/40* | (2010.01) |

(Continued)

(52) U.S. Cl.
CPC .... *H01L 31/035227* (2013.01); *H01L 27/124* (2013.01); *H01L 27/14607* (2013.01); *H01L 27/153* (2013.01); *H01L 33/06* (2013.01); *H01L 33/18* (2013.01); *H01L 33/40* (2013.01)

(58) Field of Classification Search
None
See application file for complete search history.

(56) References Cited

U.S. PATENT DOCUMENTS

| | | |
|---|---|---|
| 5,239,188 A | 8/1993 | Takeuchi et al. |
| 5,389,571 A | 2/1995 | Takeuchi et al. |
| 7,858,962 B2 | 12/2010 | Smith et al. |

(Continued)

FOREIGN PATENT DOCUMENTS

WO   WO2016100662 A1   6/2016

OTHER PUBLICATIONS

International Search Report and Written Opinion of the International Searching Authority for International Patent Application No. PCT/US2018/030692, dated Aug. 22, 2018, 18 pages.

(Continued)

*Primary Examiner* — Jay C Chang
(74) *Attorney, Agent, or Firm* — The Marbury Law Group PLLC

(57) ABSTRACT

A light emitting device, such as an LED, is formed by forming clusters of semiconductor nanostructures separated by inter-cluster regions that lack semiconductor nanostructures over a substrate, where each semiconductor nanostructure includes a nanostructure core having a doping of a first conductivity type and an active shell formed around the nanostructure core, and selectively depositing a second conductivity type semiconductor material layer having a doping of a second conductivity type on the clusters of semiconductor nanostructures. Portions of the selectively deposited second conductivity type semiconductor material layer form a continuous material layer in each cluster of semiconductor nanostructures, and the second conductivity type semiconductor material layer is not deposited in the inter-cluster regions.

9 Claims, 33 Drawing Sheets

(51) Int. Cl.
*H01L 27/146* (2006.01)
*H01L 31/0352* (2006.01)

(56) References Cited

U.S. PATENT DOCUMENTS

| | | | |
|---|---|---|---|
| 8,309,439 B2 | 11/2012 | Seifert et al. | |
| 8,350,249 B1 | 1/2013 | Svensson | |
| 8,350,251 B1 | 1/2013 | Lowgren et al. | |
| 8,664,636 B2 | 3/2014 | Konsek et al. | |
| 8,669,125 B2 | 3/2014 | Lowgren | |
| 8,669,574 B2 | 3/2014 | Konsek et al. | |
| 8,901,534 B2 | 12/2014 | Svensson | |
| 8,921,141 B2 | 12/2014 | Kryliouk et al. | |
| 8,937,295 B2 | 1/2015 | Lowgren et al. | |
| 8,999,737 B2 | 4/2015 | Harvey et al. | |
| 9,035,278 B2 | 5/2015 | Svensson et al. | |
| 9,054,233 B2 | 6/2015 | Ohlsson et al. | |
| 9,281,442 B2 | 3/2016 | Romano et al. | |
| 9,287,443 B2 | 3/2016 | Konsek et al. | |
| 9,583,533 B2 | 2/2017 | Hu et al. | |
| 2009/0169828 A1 | 7/2009 | Hersee et al. | |
| 2009/0179191 A1 | 7/2009 | Smith et al. | |
| 2010/0283064 A1 | 11/2010 | Samuelson et al. | |
| 2011/0309382 A1 | 12/2011 | Lowgren | |
| 2012/0264246 A1 | 10/2012 | Peng et al. | |
| 2013/0075693 A1* | 3/2013 | Svensson | H01L 29/0676 257/13 |
| 2013/0112944 A1 | 5/2013 | Cha et al. | |
| 2013/0221322 A1 | 8/2013 | Ohlsson | |
| 2014/0077220 A1 | 3/2014 | Kryliouk et al. | |
| 2014/0117307 A1 | 5/2014 | Herner et al. | |
| 2014/0117401 A1 | 5/2014 | Herner | |
| 2014/0139862 A1 | 5/2014 | Gha | |
| 2014/0363912 A1* | 12/2014 | Ohlsson | H01L 33/0062 438/35 |
| 2015/0333216 A1 | 11/2015 | Pourquier et al. | |
| 2016/0056331 A1* | 2/2016 | Kim | H01L 33/06 257/13 |

OTHER PUBLICATIONS

Jung, B. O. et al., "Emission Characteristics of InGaN/GaN Core-Shell Nanorods Embedded in a 3D Light-Emitting Diode," Nanoscale Research Letters, vol. 11, No. 215, pp. 1-10, (2016).
U.S. Appl. No. 15/464,641, filed Mar. 21, 2017, Glo Ab.

* cited by examiner

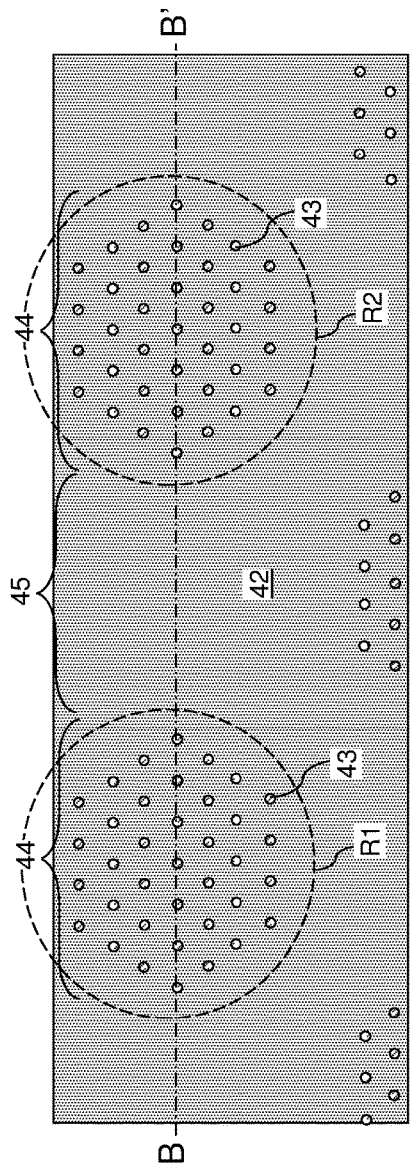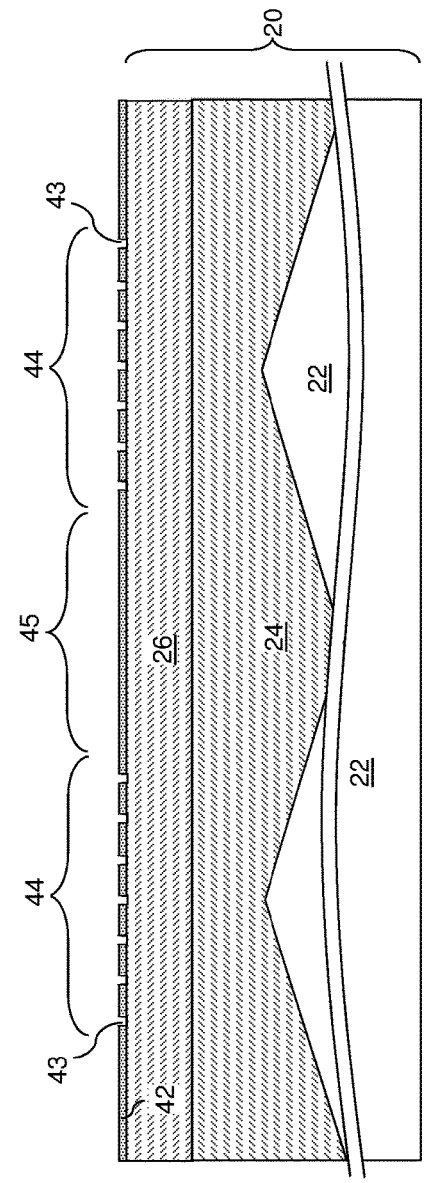
FIG. 2A
FIG. 2B

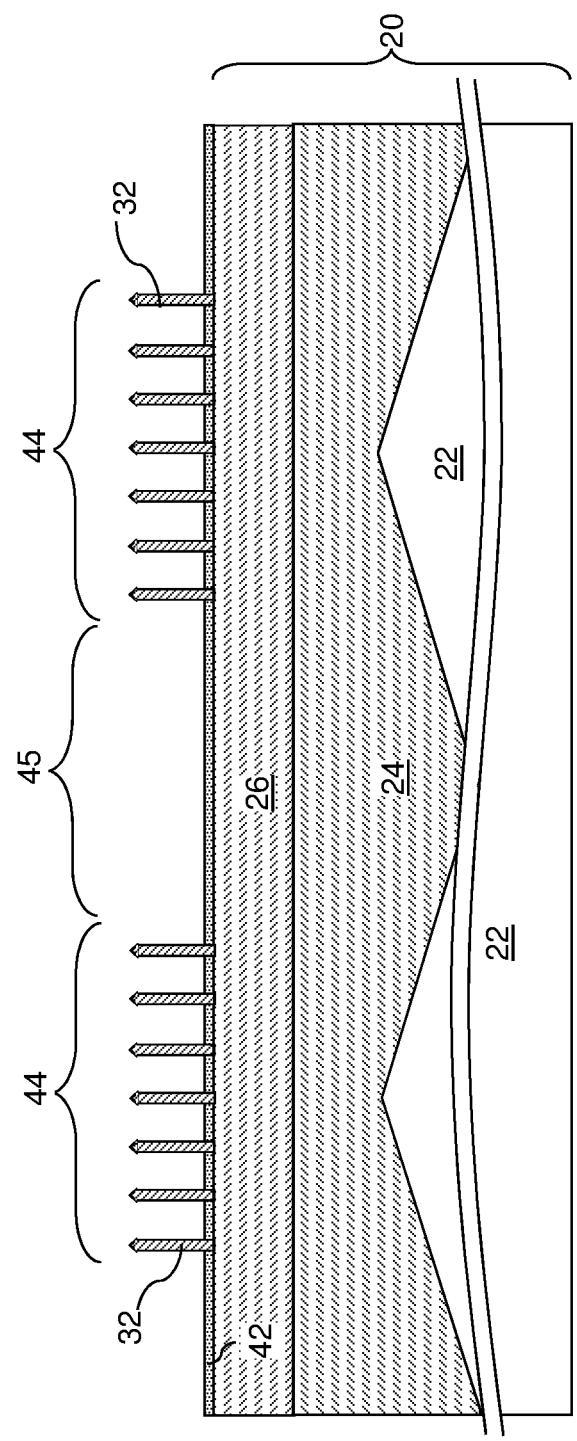

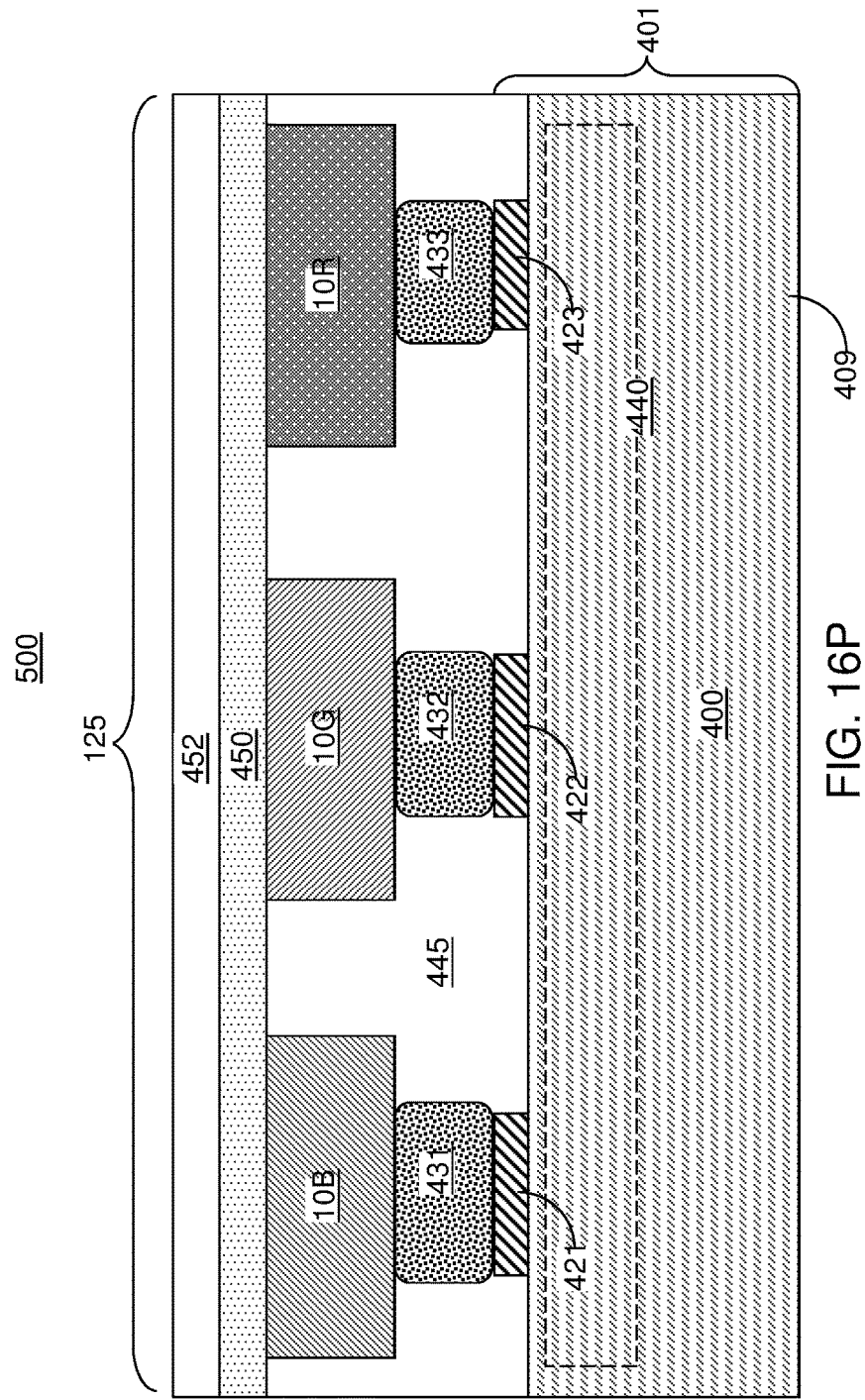

SELF-ALIGNED NANOWIRE-BASED LIGHT EMITTING DIODE SUBPIXELS FOR A DIRECT VIEW DISPLAY AND METHOD OF MAKING THEREOF

FIELD

The present invention relates to light emitting devices, and particularly to nanowire-based light emitting diode subpixels, a direct view display device employing the same, and methods of fabricating the same.

BACKGROUND

Light emitting devices such as light emitting diodes (LEDs) are used in electronic displays, such as backlights in liquid crystal displays located in laptops or televisions. Light emitting devices include light emitting diodes (LEDs) and various other types of electronic devices configured to emit light.

SUMMARY

According to an aspect of the present disclosure, a method of forming a light emitting device, such as an LED, comprises forming clusters of semiconductor nanostructures separated by inter-cluster regions that lack semiconductor nanostructures over a substrate, where each semiconductor nanostructure includes a nanostructure core having a doping of a first conductivity type and an active shell formed around the nanostructure core, and selectively depositing a second conductivity type semiconductor material layer having a doping of a second conductivity type on the clusters of semiconductor nanostructures. Portions of the selectively deposited second conductivity type semiconductor material layer form a continuous material layer in each cluster of semiconductor nanostructures, and the second conductivity type semiconductor material layer is not deposited in the inter-cluster regions.

According to another aspect of the present disclosure, a light emitting device comprises a substrate including a doped compound semiconductor layer, a growth mask layer located on a top surface of the doped compound semiconductor layer, a plurality of clusters of semiconductor nanostructures extending from a top surface of the doped compound semiconductor layer and a second conductivity type semiconductor material layer located within each cluster of semiconductor nanostructures and contacting sidewalls of each semiconductor nanostructure within each cluster of semiconductor nanostructures. The plurality of clusters are separated by inter-cluster regions that lack semiconductor nanostructures. Each semiconductor nanostructure comprises nanostructure core of a first conductivity type extending through a respective opening through the growth mask layer, and an active light emitting shell. Faceted sidewalls of the second conductivity type semiconductor material layer adjoin a top surface of the growth mask layer around a periphery of the second conductivity type semiconductor material layer, and the faceted sidewalls of the second conductivity type semiconductor material layer include crystallographic p-planes.

BRIEF DESCRIPTION OF THE DRAWINGS

FIG. 2A is a plan view of an exemplary structure including a substrate and a patterned growth mask layer according to an embodiment of the present disclosure.

FIG. 2B is a vertical cross-sectional view of the exemplary structure of FIG. 2A.

FIG. 3 is a vertical cross-sectional view of the exemplary structure after formation of nanowire cores according to an embodiment of the present disclosure.

DETAILED DESCRIPTION

As used herein, a "p-plane" means a "pyramid plane," which can by any of the $\{1\bar{1}01\}$ planes in the III-nitride system, a "c-plane" represents a $\{0001\}$ plane, and an "m-plane" represents any of the $\{1\bar{1}00\}$ planes. Growth rate means layer growth rate along the direction perpendicular to a growth surface when not otherwise specified.

A display device, such as a direct view display can be formed from an ordered array of pixels. Each pixel can include a set of subpixels that emit light at a respective peak wavelength. For example, a pixel can include a red subpixel, a green subpixel, and a blue subpixel. Each subpixel can include one or more light emitting diodes that emit light of a particular wavelength. Each pixel is driven by a backplane circuit such that any combination of colors within a color gamut may be shown on the display for each pixel. The display panel can be formed by a process in which LED subpixels are soldered to, or otherwise electrically attached to, a bond pad located on a backplane. The bond pad is electrically driven by the backplane circuit and other driving electronics.

In the embodiments of the present disclosure, a method for fabrication of a multicolor (e.g., three or more color) direct view display may be performed by using light emitting devices which emit different color light in each pixel. In one embodiment, nanostructure (e.g., nanowire) or bulk (e.g., planar) LEDs may be used. Each LED may have a respective blue, green and red light emitting active region to form blue, green and red subpixels in each pixel. In another embodiment, a down converting element (e.g., red emitting phosphor, dye or quantum dots) can be formed over a blue or green light emitting LED to form a red emitting subpixel. In another embodiment, a blue or green light emitting nanowire LED in each pixel is replaced with a regrown red emitting planar LED, such as an organic or inorganic red emitting planar LED to form a red emitting subpixel.

Figure 1A:
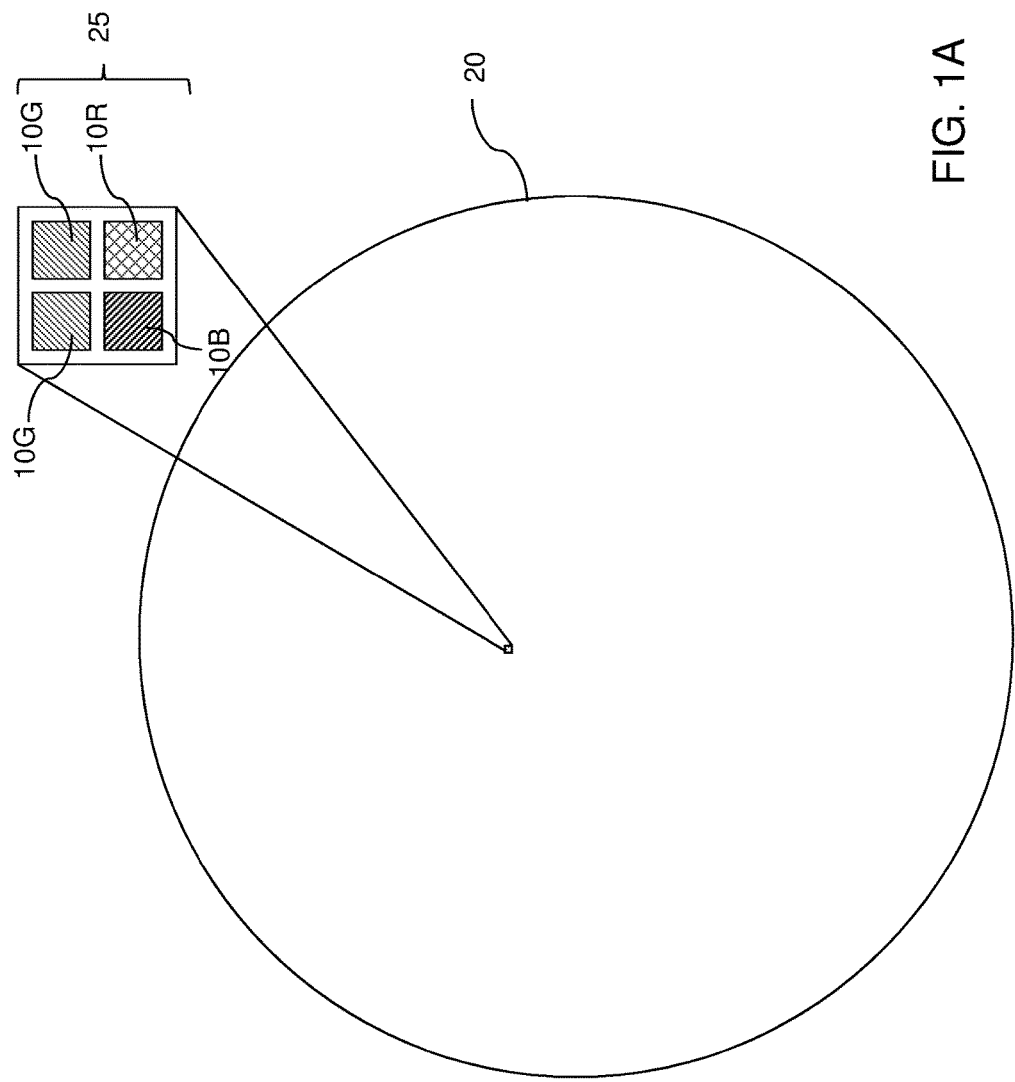
FIG. 1A is a plan view of a substrate with light emitting diodes of multiple colors according to an embodiment of the present disclosure.

FIG. 1A illustrates a substrate 20 on which an array of pixels 25 is fabricated. Each pixel 25 can include a plurality of subpixels (10B, 10G, 10R), each of which includes a cluster of light emitting nanowires configured to emit light at a respective wavelength. Each pixel 25 can include light emitting diodes that emit light at different wavelengths. For example, each pixel 25 can include at least one first-type light emitting diode 10G (such as at least one green-light-emitting diode, for example two green-light-emitting diodes) that emits light at a first peak wavelength (such as a peak wavelength in a range from 495 nm to 570 nm), at least one second-type light emitting diode 10B (such as at least one blue-light-emitting diode) that emits light at a second peak wavelength (such as a peak wavelength in a range from 400 nm to 495 nm), and at least one third-type light emitting diode 10R (such as at least one red-light-emitting diode 10R) that emits light at a third peak wavelength (such as a peak wavelength in a range from 600 nm to 700 nm). The number of each type of light emitting diodes within a pixel 25 can be selected to provide a suitable level of illumination per pixel. For example, plural nanowire LEDs which emit green, blue and red light are formed in each respective green, blue and red light emitting areas of the pixel 25. Optionally, one of the sites in the pixel 25 (e.g., the site of one of the green-emitting LEDs 10G) may be left vacant as a repair site for later attaching a repair LED device to compensate for a defective or non-functioning LED device 10G, 10B or 10R in a particular pixel 25. A vacant site may be employed for one or more additional functionalities for a display device such as touch recognition through use of an infrared photodiode sensor. Methods of forming light emitting diodes having different peak wavelengths on a single semiconductor substrate, i.e., without stacking multiple substrates over one another, is disclosed, for example, in U.S. Pat. No. 9,054,233 B2 to Ohlsson et al, which is incorporated herein by reference in its entirety.

The pixels 25, or a subset of the subpixels (10B, 10G, 10R) can be subsequently transferred to a backplane to provide a direct view display device, as will be described in more detail below. As used herein, a direct view display device refers to a display device in which each pixel 25 includes at least one light source that generates light from within upon application of a suitable electrical bias. Thus, a direct view display device does not require a back light unit or a liquid crystal material. As used herein, a "multicolor" pixel refers to a pixel that can emit light of different peak wavelengths depending on application of electrical bias, and thus, inherently capable of displaying multiple colors.

Figure 1B:
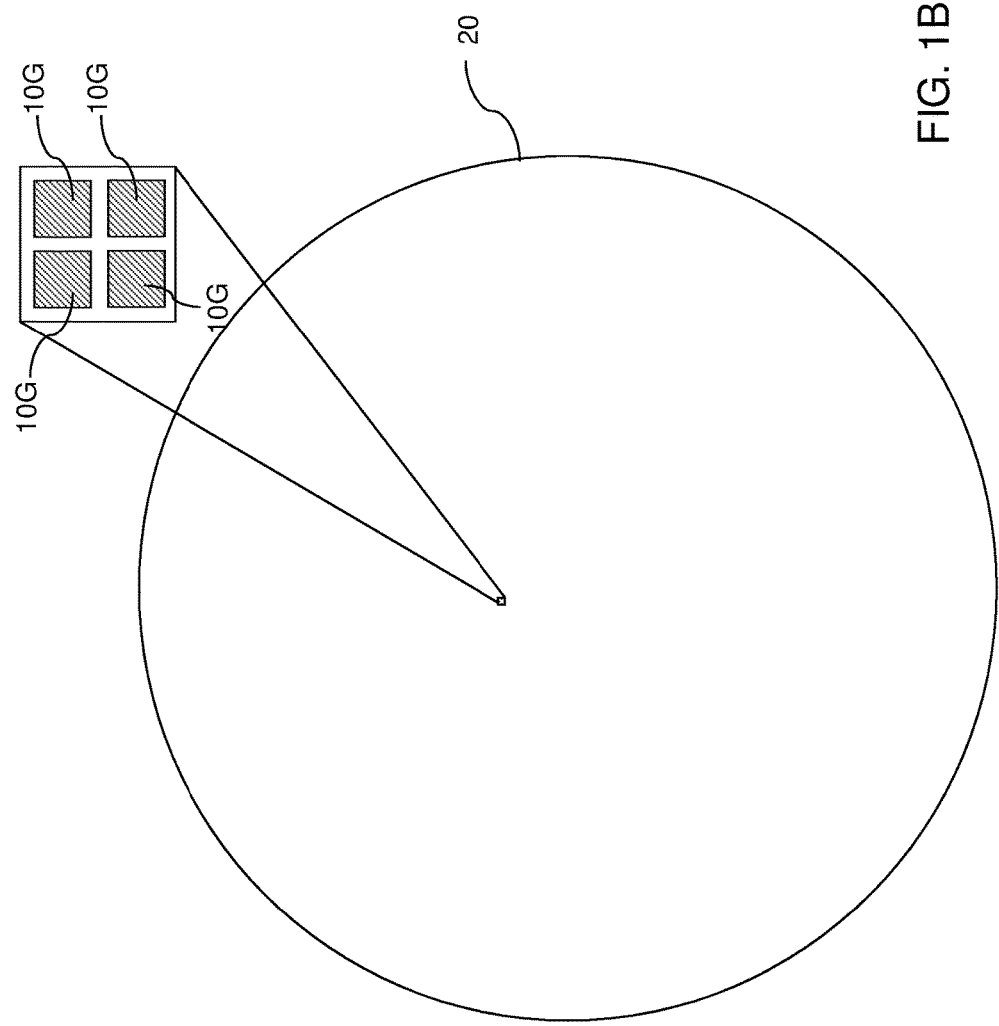
FIG. 1B is a plan view of a substrate with light emitting diodes of a same color according to an embodiment of the present disclosure.

Alternatively, only a single type of subpixels configured to emit light at a same peak wavelength may be formed on a substrate 20 instead of multiple types of subpixels (10B, 10G, 10R). FIG. 1B illustrates a substrate 20 on which only a single type of subpixels 10G (e.g., green light emitting LEDs) is formed. In this case, multiple substrates 20 can be employed as sources for multiple types of subpixels. For example, a first substrate can include subpixels 10G of a first type that emit light at a first wavelength, a second substrate can include subpixels 10B of a second type that emit light at a second wavelength (e.g., blue light emitting LEDs), and so on (e.g., third substrate can include subpixels 10R of a third type that emit light at a third wavelength, such as red light emitting LEDs).

Referring to FIGS. 2A and 2B, an exemplary structure is illustrated, which is an in-process structure for fabricating monolithic multicolor pixels 25 or single color subpixels (10B, 10G or 10R) on the substrate 20, such as an initial growth substrate. As used herein, an "in-process" structure refers to a structure that is subsequently modified to make a final structure. The exemplary structure can include a stack, from bottom to top, of a support substrate 22, an optional buffer layer 24, and a doped compound semiconductor layer 26. The support substrate 22 can include a single crystalline material layer that functions as a template for growing a single crystalline semiconductor material of the buffer layer 24. Any single crystalline material layer can be employed for the support substrate 22 provided that epitaxial growth of a compound semiconductor material, such as a III-V compound semiconductor material, from the top surface of the single crystalline material layer is possible. The support substrate 22 can include a single crystalline material such as $Al_2O_3$ (sapphire) using either basal plane or r-plane growing surfaces, diamond, Si, Ge, GaN, AN, SiC in both wurtzite ($\alpha$) and zincblende ($\beta$) forms, InN, GaP, GaAsP, GaAs, InP, ZnO, ZnS, and ZnSe. For example, the support substrate 22 can include sapphire (i.e., single crystalline aluminum oxide) with a suitable surface orientation.

The support substrate 22 may comprise a patterned sapphire substrate (PSS) having a patterned (e.g., rough) growth surface. Bumps, dimples, and/or angled cuts may, or may not, be provided on the top surface of the support substrate 22 to facilitate epitaxial growth of the single crystalline compound semiconductor material of the buffer layer, to facilitate separation of the buffer layer 24 from the support substrate 22 in a subsequent separation process and/or to improve the light extraction efficiency through the buffer layer 24. If bumps and/or dimples are provided on the top surface of the support substrate 22, the lateral dimensions of each bump or each dimple can be in a range from 1.5 micron to 6 micron although lesser and greater lateral dimensions can also be employed. The center-to-center distance between neighboring pairs of bumps or dimples can be in a range from 3 microns to 15 microns, although lesser and greater distances can also be employed. Various geometrical configurations can be employed for arrangement of the bumps or dimples. The height of the bumps and/or the depth of the dimples may be in on the order of 1 microns to 3 microns, although lesser and greater heights and/or depths can also be employed.

The buffer layer 24 includes a single crystalline compound semiconductor material such as a III-V compound semiconductor material, for example a Group III-nitride compound semiconductor material. The deposition process for forming the buffer layer 24 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The buffer layer 24 can have a constant or a graded composition such that the composition of the buffer layer 24 at the interface with the support substrate 22 provides a substantial lattice matching with the two-dimensional lattice structure of the top surface of the support substrate 22. The composition of the buffer layer 24 can be gradually changed during the deposition process. If a PSS support substrate 22 is used, then the bottom surface of the buffer layer 24 may be a patterned (i.e., rough) surface.

The materials that can be employed for a bottom portion of the buffer layer 24 can be, for example, $Ga_{1-w-x}In_wAl_xN$ in which w and x range between zero and less than one, and can be zero (i.e., GaN) and are selected to match the lattice constant of the top surface of the support substrate 22. Optionally, As and/or P may also be included in the material for the bottom portion of the buffer layer, in which case the bottom portion of the buffer layer 24 can include $Ga_{1-w-x}In_wAl_xN_{1-x-z}As_yP_z$ in which y and z between zero and less than one, that matches the lattice constant of the top surface of the support substrate 22. The materials that can be employed for an top portion of the buffer layer 24 include, but are not limited to, III-V compound materials, including III-nitride materials, such as gallium nitride (GaN), aluminum nitride (AlN), indium nitride (InN), gallium aluminum nitride, and gallium indium nitride, as well as other III-V materials, such as gallium phosphide (GaP), gallium arsenide (GaAs), gallium antimonide (GaSb), Indium phosphide (InP), indium arsenide (InAs), and indium antimonide (InSb).

The composition of the buffer layer 24 can gradually change between the bottom portion of the buffer layer 24 and the top portion of buffer layer 24 such that dislocations caused by a gradual lattice parameter change along the growth direction (vertical direction) does not propagate to the top surface of the buffer layer 24. In one embodiment, a thin bottom portion of the buffer layer 24 less than 1 micron in thickness may be undoped or doped at a low concentration of silicon.

A high quality single crystalline surface with low defect density can be provided at the top surface of the buffer layer 24. Optionally, the top surface of the buffer layer 24 may be planarized to provide a planar top surface, for example, by chemical mechanical planarization. A suitable surface clean process can be performed after the planarization process to remove contaminants from the top surface of the buffer layer 24. The average thickness of the buffer layer 24 may be in a range from 2 microns to 20 microns, although lesser and greater thicknesses can also be employed.

The doped compound semiconductor layer 26 is subsequently formed directly on the top surface of the buffer layer 24. The doped compound semiconductor layer 26 includes a doped compound semiconductor material having a doping of a first conductivity type. The first conductivity type can be n-type or p-type. In one embodiment, the first conductivity type can be n-type.

The doped compound semiconductor layer 26 can be lattice matched with the single crystalline compound semiconductor material of the top portion of the buffer layer 24. The doped compound semiconductor layer 26 may, or may not, include the same compound semiconductor material as the top portion of the buffer layer 24. In one embodiment, the doped compound semiconductor layer 26 can include an n-doped direct band gap compound semiconductor material. In one embodiment, the doped compound semiconductor layer 26 can include n-doped gallium nitride (GaN). The deposition process for forming doped compound semiconductor layer 26 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The thickness of the doped compound semiconductor layer 26 can be in a range from 100 nm to 2 microns, although lesser and greater thicknesses can also be employed.

A patterned growth mask layer 42 can be formed on the top surface of the substrate 20 (e.g., on top of the doped compound semiconductor layer 26). The patterned growth mask layer 42 can be formed, for example, by depositing a dielectric material layer and patterning the dielectric material layer to form openings 43 therein. For example, a silicon nitride layer, a silicon oxide layer, or a dielectric metal oxide layer (such as an aluminum oxide layer) can be formed on the top surface of the substrate 20. In one embodiment, the dielectric material layer can include a silicon nitride layer. The thickness of the dielectric material layer can be in a range from 3 nm to 100 nm, although lesser and greater thicknesses can also be employed.

A photoresist layer (not shown) can be applied over the top surface of the dielectric material layer, and can be lithographically patterned to form openings therethrough by lithographic exposure and development. In one embodiment, the openings in the photoresist layer can be formed as a two-dimensional periodic array. The size and shape of each opening can be selected to optimize the shape and size of nanowires to be subsequently formed. The pattern of the openings in the photoresist layer can be transferred through the dielectric material layer to form the patterned growth mask layer 42. The photoresist layer can be subsequently removed, for example, by ashing.

The patterned growth mask layer 42 includes openings 43, which may, or may not, be arranged as a two-dimensional periodic array. The shape of each opening 43 may be circular, elliptical, or polygonal (such as hexagonal). A portion of the top surface of the doped compound semiconductor layer 26 is physically exposed underneath each opening 43 through the patterned growth mask layer 42.

As shown in FIG. 2A, the openings 43 through the patterned growth mask layer 42 can form a pattern of clusters 44 that are laterally spaced from one another. Each cluster 44 of openings 43 can be located within a respective nanowire region (R1, R2) that is laterally spaced apart from one another by an inter-cluster region 45 that lacks openings 43 and having a spacing that is greater than the average nearest neighbor distance among openings within each of the nanowire cluster 44 regions (R1, R2). The spacing that can be greater than the average nearest neighbor distance among openings within each of the nanowire cluster 44 regions by at least 10%, such as by at least 50%, such as by at least two times. In one embodiment, the openings 43 within each cluster 44 can be arranged as a periodic two-dimensional array. In one embodiment, each cluster 44 of openings 43 can be a periodic two-dimensional array of openings 43 having a same periodicity. For example, each cluster 44 of openings 43 can be a hexagonal array of openings 43 in which the openings have a same shape and size. The periodicity may be the same within each hexagonal array of openings 43. Alternatively, a rectangular array may be employed for each cluster of openings 43. Each cluster 44 can be bounded by imaginary straight or curved lines which follow the outermost openings 43 in each cluster 44. For example, each cluster 44 having a hexagonal array of openings 43 may have six straight lines as an outer boundary, and each cluster 44 having a rectangular array of openings 43 may have four straight lines as an outer boundary.

The maximum dimension of each opening 43 (which may be a diameter, a major axis, or a diagonal dimension) may be in a range from 5 nm to 500 nm (such as from 10 nm to 250 nm), although lesser and greater dimensions may also be employed. The nearest neighbor distance within the periodic array of openings 43 can be in a range from 100 nm to 10 microns, such as from 500 nm to 1 micron, although lesser and greater nearest neighbor distances can also be employed. The total number of openings 43 within each cluster 44 of openings 43 (which may be each array of openings 43) can be in a range from 1 to 1000, such as from 10 to 30, although lesser and greater number of openings can also be employed. The length of each cluster 44 (i.e., the length of each outer boundary segment of the cluster) can be 1 to 100 microns, such as 1 to 5 microns, for example 2 to 4 microns for a micro-LED type direct view display. The minimum distance (i.e., the length of the inter-cluster region 45) between the outer boundaries of each neighboring pair of clusters 44 of openings 43 can be in a range from 2 to 20 times (such as 3 to 10 times) a pitch of the openings 43 (i.e., distance between nearest neighbor openings) in either of the neighboring pair of clusters 44 of openings 43, although lesser and greater distances can also be employed. The outer boundaries of each cluster 44 can correspond to the outer boundaries of a subpixel 10G, 10B, 10R of a direct view display device or to regions, such as pixels or subpixels of a monochrome light emitting device. Generally, the spacing between neighboring clusters 44 of openings 43 can be selected such that multiple portions of a second conductivity type semiconductor material layer to be subsequently formed do not merge between any neighboring pair of clusters after formation.

While only a region of the exemplary structure is illustrated herein, it is understood that the exemplary structure can laterally extend along two independent horizontal directions as a two-dimensional array. The exemplary pattern illustrated in FIG. 2A may be repeated across a region of the substrate 20, or across the entirety of the substrate 20. Thus, multiple instances of the illustrated structures in the drawings can be formed in the exemplary structure.

Referring to FIG. 3, an array of nanowires cores 32 is grown through the openings 43 in the patterned growth mask layer 42. Each nanowires core 32 includes a doped compound semiconductor material having a doping of the first conductivity type, i.e., the conductivity type of doping of the doped compound semiconductor layer 26. The material of the nanowires cores 32 may be the same as, or may be different from, the material of the doped compound semiconductor layer 26. In one embodiment, the first conductivity type can be n-type, and each nanowires core 32 includes an n-doped compound semiconductor material such as III-nitride compound semiconductor material, for example n-doped gallium nitride. Alternatively, any other suitable III-V or II-VI material may be used.

Each of the nanowire cores 32 can be formed with a set of substantially vertical sidewalls and a tip portion having angled facets, i.e., facets that are not horizontal and not vertical (i.e., not parallel or perpendicular to the top surface of the substrate 20). The nanowires cores 32 can be grown, for example, by selective epitaxial growth of an n-doped compound semiconductor material. The process parameters of the selective epitaxial growth process can be selected such that an n-doped compound semiconductor material grows upward with substantially vertical sidewalls having an m-plane outer surface and angled facets having a p-pane outer surface from each opening 43 through the patterned growth mask layer 42. Methods for growing the nanowires cores 32 through the openings 43 in the patterned growth mask layer 42 with substantially vertical sidewalls and faceted tip portion are described, for example, in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al., which is assigned to QuNano AB, all of which are incorporated herein by reference in their entirety. In one embodiment, the height of the nanowires cores 32 can be in a range from 200 nm to 5 microns, although lesser and greater heights can also be employed. In the above described embodiment, the nanowire core growth step occurs through an opening 43 in a mask 42. However, any other suitable nanowire growth regime can be utilized, such as VLS growth using a catalyst particle or other selective growth methods. Thus, the selective nanowire growth is therefore used to merely exemplify rather than limit the invention.

Figure 4:
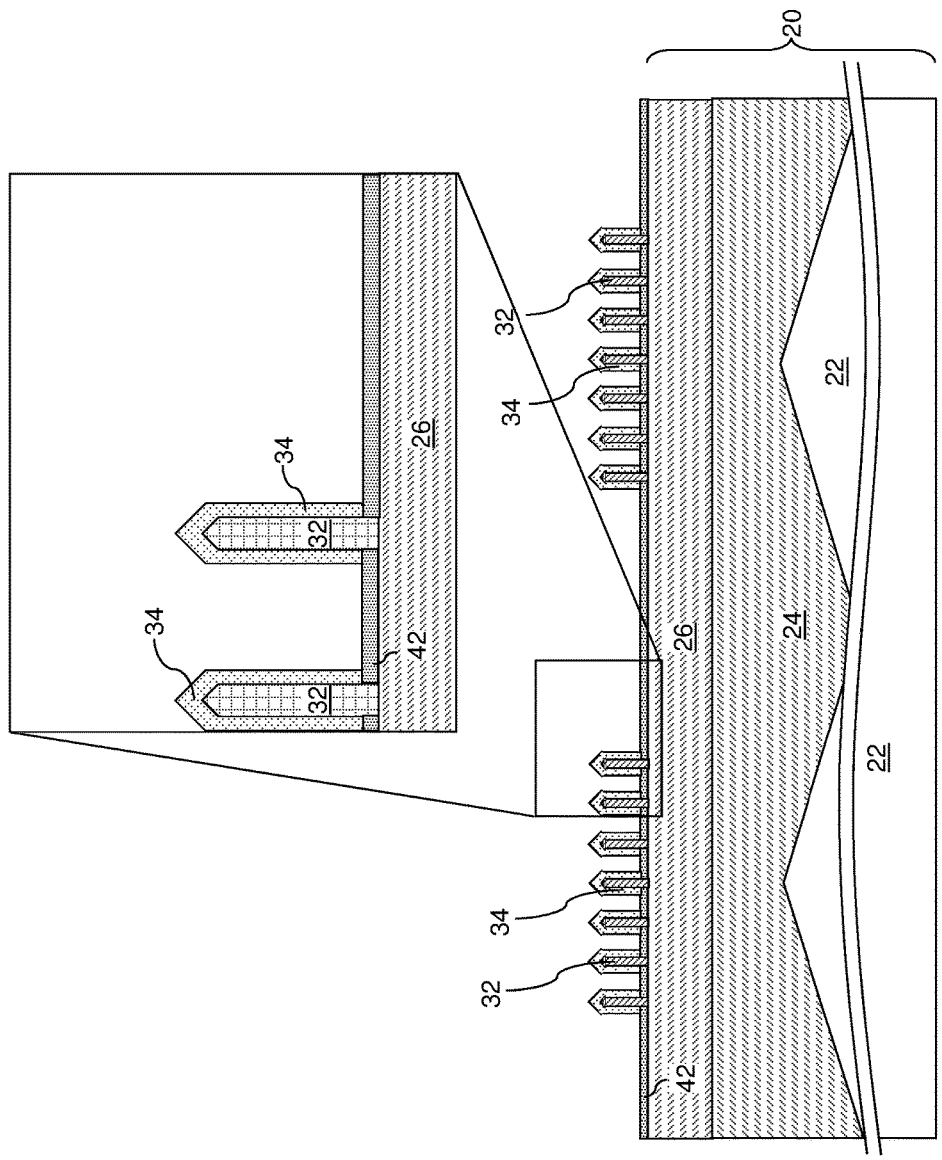
FIG. 4 is a vertical cross-sectional view of the exemplary structure after formation of active shells according to an embodiment of the present disclosure.

Referring to FIG. 4, an active shell 34 is formed on each nanowires core 32. The active shell 34 includes at least one semiconductor material that emits light upon application of a suitable electrical bias. For example, each active shell 34 can include a single or a multi-quantum well (MQW) structure that emits light upon application of an electrical bias thereacross. For example, the quantum well(s) may comprise indium gallium nitride well(s) located between gallium nitride or aluminum gallium nitride barrier layers. Alternatively, the active shell 34 can include any other suitable semiconductor layers or stack of layers for light emitting diode applications provided that it can be grown on the surfaces of the nanowires cores 32. The set of all layers within an active shell 34 is herein referred to as an active layer. The active shell may emit any color light, such as blue, green or red light.

A selective epitaxy process can be employed to grow the active shells 34. The process parameters of the selective epitaxy process can be selected such that the active shells 34 are grown as conformal structures having a same thickness throughout. In another embodiment, the active shells 34 can be grown as a pseudo-conformal structure in which the vertical portions have the same thickness throughout, and faceted portions over the tips of the nanowires cores 32 have thicknesses that differ from the thickness of the vertical portions. Methods for growing the active shells 34 on the nanowires cores 32 are described, for example, in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al., which is assigned to QuNano AB, all of which are incorporated herein by reference in their entirety. In one embodiment, the outer surfaces of the active shells 34 can include vertical faceted surfaces (i.e., vertical sidewalls) that extend perpendicular to the top surface of the doped compound semiconductor layer 26, and tapered faceted surfaces (i.e., tapered sidewalls) located at a tip of each semiconductor nanowire (32, 34) within the array of semiconductor nanowires and adjoined to an upper edge of a respective one of the vertical faceted surfaces. In one embodiment, the vertical faceted surfaces of the active shells 34 can include crystallographic m-planes, and the tapered faceted surfaces of the active shells 34 can include crystallographic p-planes.

The thickness of the vertical portions of the active shells 34 can be selected such that the active shells 34 do not merge among one another. The thickness of the vertical portions of the active shells 34 (as measured horizontally along a radial direction) can be in a range from 100 nm to 1 micron, although lesser and greater thicknesses can also be employed. Each active shell 34 includes an active light emitting layer. The composition of the active shells 34 can be selected to emit light at a desired peak wavelength by changing the composition and strain of the active shells 34. The active shells 34 can have the same composition and emit light of the same peak wavelength in each cluster 44 (e.g., having the structure shown in FIG. 1B). Alternatively, different clusters 44 can have active shells 34 with different compositions such that the active shells 34 in different clusters 44 emit light with a different peak wavelength (e.g., having the structure shown in FIG. 1A).

Each set of a nanowires core 32 and an active shell 34 that contacts, surrounds, and overlies the nanowires core 32 constitutes a nanowire (32, 34). While nanowires are described as an embodiment of the nanostructure, other nanostructures, such as nanopyramids, can also be used. The nanowires (32, 34) are located in the clusters 44 and can be formed as a two-dimensional array having periodicity along two independent directions in each cluster 44. Each cluster 44 corresponds to a subpixel (10G, 10B or 10R) of the direct view display device. Each nanowire (32, 34) within the array extends vertically from the top surface of the doped compound semiconductor layer 26. Each nanowire (32, 34) within the array includes a nanowire core 32 having a doping of the first conductivity type and an active shell 34 including a preferably undoped or intrinsic active layer which emits light upon application of electrical bias therethrough.

Figure 5:
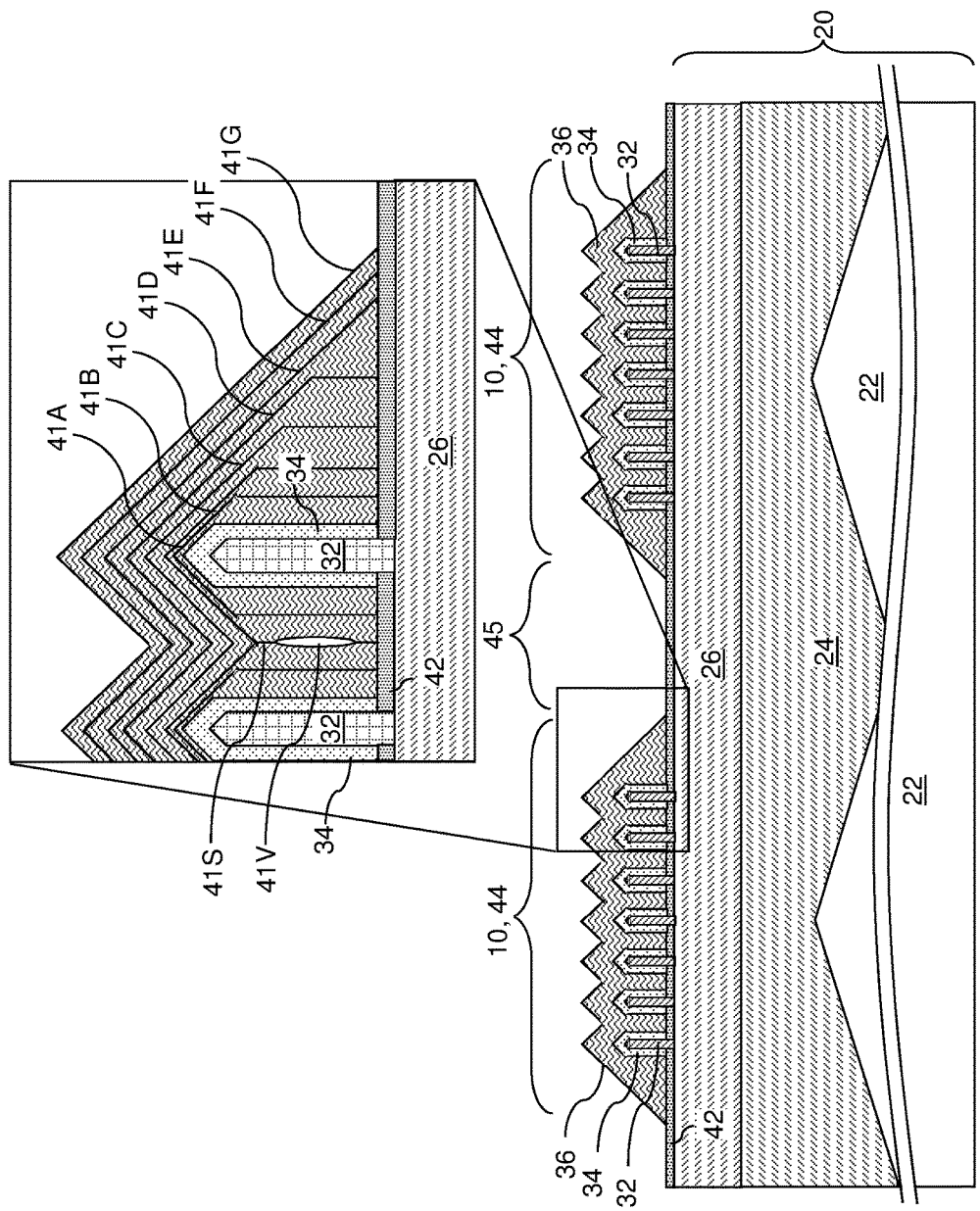
FIG. 5 is a vertical cross-sectional view of the exemplary structure after formation of a second conductivity type semiconductor material layer according to an embodiment of the present disclosure.

Referring to FIG. 5, a second conductivity type semiconductor material layer 36 is formed on the sidewalls and faceted outer surfaces of the nanowires (32, 34). The second conductivity type semiconductor material layer 36 includes a doped semiconductor material having a doping of a second conductivity type, which is the opposite of the first conductivity type. For example, if the first conductivity type is n-type, then the second conductivity type is p-type. If the first conductivity type is p-type, then the second conductivity type is n-type.

The second conductivity type semiconductor material layer 36 can include a compound semiconductor material. The compound semiconductor material of the second conductivity type semiconductor material layer 36 can be any suitable semiconductor material, such as p-type III-nitride compound semiconductor material, e.g., gallium nitride and/or aluminum gallium nitride. In one embodiment, the nanowires cores 32 can include n-doped GaN, and the second conductivity type semiconductor material layer 36 can include p-doped InGaN or GaN.

The second conductivity type semiconductor material layer 36 can be formed by selective deposition of the doped semiconductor material on the outer surfaces of the active regions 34. For example, a selective epitaxy process can be employed.

During the selective deposition process (which can be a selective epitaxy process), discrete semiconductor material portions grow from the outer surfaces of each of the active regions until the discrete semiconductor material portions merge to form the second conductivity type semiconductor material layer 36 as a continuous semiconductor material layer in each cluster 44. In other words, duration and deposition rate of the selective deposition process can be selected so that the volumes between neighboring pairs of nanowires (32, 34) in each cluster 44 are filled with merged vertical portions of the second conductivity type semiconductor material layer 36. For example, the control of when the second type conductivity type semiconductor material meets can be done by controlling the volume of the deposited material (e.g., deposition duration and deposition rate). The desired volume can be achieved by control of individual facet relative growth rates (process parameters such as temperature, pressure, input precursor gas ratios and/or composition of (Al,In,Ga)N material). Upon continued deposition of the doped semiconductor material on the active shells 34, the deposited semiconductor material portions coalesce to form the second conductivity type semiconductor material layer 36 as a continuous layer contacting each active shell 34 within the array of semiconductor nanowires (32, 34) in each cluster 44 but not in the intercluster region 45 which lacks the semiconductor nanowires (32, 34) and the second conductivity type semiconductor material layer 36. Each cluster 44 of nanowires (32, 34) and portion of the second conductivity type semiconductor material layer 36 comprises an in-process subpixel (10G, 10B or 10R) of a direct view display device.

Prior to merging, each of the discrete portions of the deposited doped semiconductor material can grow with faceted surfaces, which can include vertical (e.g., m-plane) faceted surfaces that are parallel to the vertical faceted surfaces of the active region 34 on which a respective doped semiconductor material portion grows, and tapered (e.g., p-plane) faceted surfaces that are parallel to the tapered faceted surface of the active region 34 on which the respective doped semiconductor material portion grows.

A vertical cross-sectional profile of the discrete deposited semiconductor material portions prior to merging is illustrated as contour 41A in the inset of FIG. 5. A vertical cross-sectional profile of the discrete deposited semiconductor material portions at the time of merging is illustrated as contour 41B. Vertical cross-sectional profiles of the merged deposited semiconductor material portions after formation of a continuous doped semiconductor material layer as the second conductivity type semiconductor material layer 36 is illustrated as contours 41C, 41D, 41E, 41F, and 41G. The contour lines represent a progression of growth rather than interfaces.

The growth rate at various faceted surfaces may be different during the selective epitaxy process. For example, the growth rate from the m-planes prior to merging of the discrete portions of the deposited doped semiconductor material may be in a range of 3-15 times the growth rate from the p-planes prior to merging. Merging of the m-planes between neighboring pairs of deposited doped semiconductor material portions reduces the total area of remaining m-planes abruptly (which becomes the sum of the physically exposed m-planes at the periphery of each cluster 44 of semiconductor nanowires (32, 34)). Thus, the growth rate from the p-planes of the second conductivity type semiconductor material layer 36 (which is a continuous structure including the merged semiconductor material portions) may increase by a factor greater than 1, which can be in a range from 2 to 6 under typical growth conditions).

The second conductivity type semiconductor material layer 36 is deposited on vertical faceted surfaces of the active regions 34 that extend perpendicular to the top surface of the doped compound semiconductor layer 26, and on tapered faceted surfaces provided at a tip of each semiconductor nanowire (32, 34) within the cluster 44 of semiconductor nanowires (32, 34) and adjoined to an upper edge of a respective one of the vertical faceted surfaces. In one embodiment, the second conductivity type semiconductor material layer 36 can include vertical seams 41S at locations that are equidistant from outer sidewalls of a neighboring pair of active light emitting layers of the active shells 34. In some embodiments, the second conductivity type semiconductor material layer 36 can embed optional cavities 41V between neighboring pairs of semiconductor nanowires (32, 34) among the array of semiconductor nanowires with a same cluster. Alternatively, the cavities 41V can be omitted.

The selective deposition of the doped semiconductor material having a doping of the second conductivity type can continue until all vertical faceted surfaces of the second conductivity type semiconductor material layer 36 disappear, i.e., until p-plane faceted sidewalls of the second conductivity type semiconductor material layer 36 extend to the top surface of the growth mask layer 42 around a bottom periphery of the second conductivity type semiconductor material layer 36.

For example, the remaining vertical faceted surfaces of the second conductivity type semiconductor material layer 36 after formation of the vertical seams 41S can include vertical faceted sidewalls that are adjoined among one another to form a continuous periphery that encircles a respective cluster 44 of semiconductor nanowires (32, 34). In this case, the growth of the second conductivity type semiconductor material layer 36 perpendicular to the vertical faceted sidewalls proceeds at least at the growth rate of tapered faceted sidewalls of the second conductivity type semiconductor material layer 36 until the height of each vertical faceted sidewall shrinks to zero. In this case, the growth rate from the m-planes proceeds at least at the rate from the growth rate from p-planes, and typically at a higher growth rate than the growth rate from the p-planes, such as by at least 10%, such as by at least 50%, such as by a factor of 2 or more, until all the m-planes disappear with growth of the second conductivity type semiconductor material layer 36.

The second conductivity type semiconductor material layer 36 includes a horizontally extending portion that continuously extends horizontally and overlies the cluster 44 of nanowires (32, 34) and vertical portions that are located between neighboring pairs of nanowires (32, 34). The horizontally extending portion of the second conductivity type semiconductor material layer 36 contacts faceted surfaces of the nanowires (32, 34) and has a resulting roughened or faceted surface. The horizontally extending portion of the second conductivity type semiconductor material layer 36 overlies the vertical portions of the second conductivity type semiconductor material layer 36. Each vertical portion of the second conductivity type semiconductor material layer 36 can contact a portion of the top surface of the patterned growth mask layer 42 and can be adjoined to the horizontally extending portion of the second conductivity type semiconductor material layer 36. The thickness of the horizontally extending portion of the second conductivity type semiconductor material layer 36 (as measured along the vertical direction) can be in a range from 50 nm to 2 microns, such as from 200 nm to 1 micron, although lesser and greater thicknesses can also be employed.

Each second conductivity type semiconductor material layer 36 over a cluster 44 of semiconductor nanowires (32, 34) (which may be a two-dimensional periodic array of semiconductor nanowires (32, 34) within a corresponding area) contacts sidewalls of each semiconductor nanowire (32, 34) within the cluster 44. Faceted (e.g., tapered) sidewalls of the second conductivity type semiconductor material layer 36 adjoin a top surface of the growth mask layer 42 around a periphery of the second conductivity type semiconductor material layer 36. In one embodiment, the periphery of the second conductivity type semiconductor material layer 36 that adjoins the top surface of the growth mask layer 42 can have multiple linear segments, such as a set of six linear segments corresponding to six sides of a hexagon if the outer periphery of the cluster has a hexagonal shape in one embodiment. As used herein, a first element adjoins a second element if physical contact between the first and second elements is at least one-dimensional (i.e., includes a curve, a line, or a surface). Alternatively, the cluster can have a rectangular or circular shape. In one embodiment, the periphery is aligned to the underlying material crystal symmetry, such that the non-vertical p-plane facets are aligned at the periphery. This would produce a non-staggered outlined of the cluster, and may provide a tighter packing of the clusters (i.e., reduce the LED pitch). Each second conductivity type semiconductor material layer 36 can be a continuous material layer and contacting all outer surfaces of the active shells 34 of the array of semiconductor nanowires (32, 34) within a respective cluster 44 of semiconductor nanowires (32, 34). In one embodiment, each of the faceted sidewalls of the second conductivity type semiconductor material layer 36 that adjoins the top surface of the growth mask layer 42 is at a same angle with respect the horizontal plane including the top surface of the growth mask layer 42. In one embodiment, the faceted sidewalls of the second conductivity type semiconductor material layer 36 include crystallographic p-planes, and the top surface of the growth mask layer 42 can be parallel to the crystallographic c-planes of the single crystalline structures in the exemplary structure. In one embodiment, each of the faceted sidewalls of the second conductivity type semiconductor material layer 36 extends within a respective two-dimensional plane from the top surface of the growth mask layer 42 to a location overlying a tip of a respective outermost semiconductor nanowire (32, 34) in each cluster 44.

Figure 6:
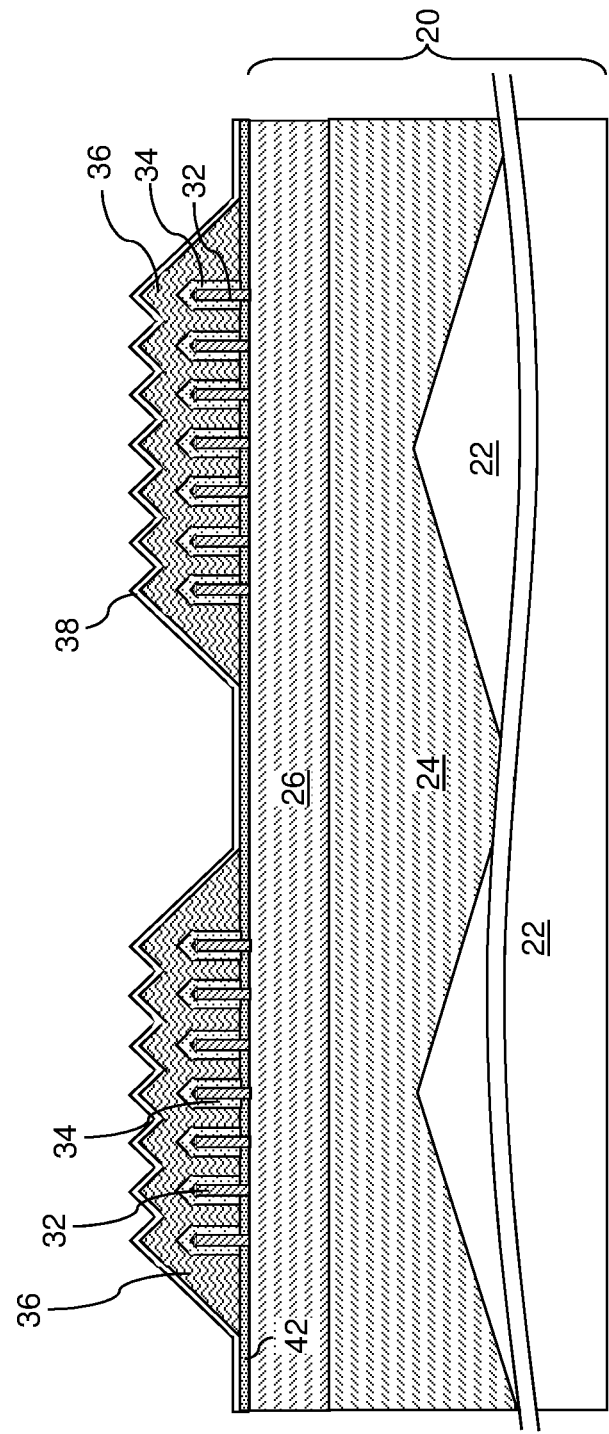
FIG. 6 is a vertical cross-sectional view of the exemplary structure after formation of a transparent conductive oxide layer according to an embodiment of the present disclosure.

Referring to FIG. 6, an optional transparent conductive layer 38, such as a transparent conductive oxide layer can be deposited over the horizontally extending portion of the second conductivity type semiconductor material layer 36. The transparent conductive oxide layer 38 includes a transparent conductive oxide material, as indium tin oxide, aluminum doped zinc oxide, or another suitable material. The transparent conductive oxide layer 38 can be deposited as a continuous material layer that extends across the entire area of the second conductivity type semiconductor material layer 36, i.e., across the entire area of each cluster 44, and in the inter-cluster region 45. The thickness of the transparent conductive oxide layer 38 can be in a range from 5 nm to 600 nm, such as from 10 nm to 300 nm, although lesser and greater thicknesses can also be employed.

Alternatively, the transparent conductive layer 38 may be replaced with a silver layer, which can be deposited by physical vapor deposition and annealed to provide a contact to a p-type semiconductor material. In this case, the silver layer can function as a reflector material layer and subsequent deposition of a reflector material layer can be omitted.

Figure 7:
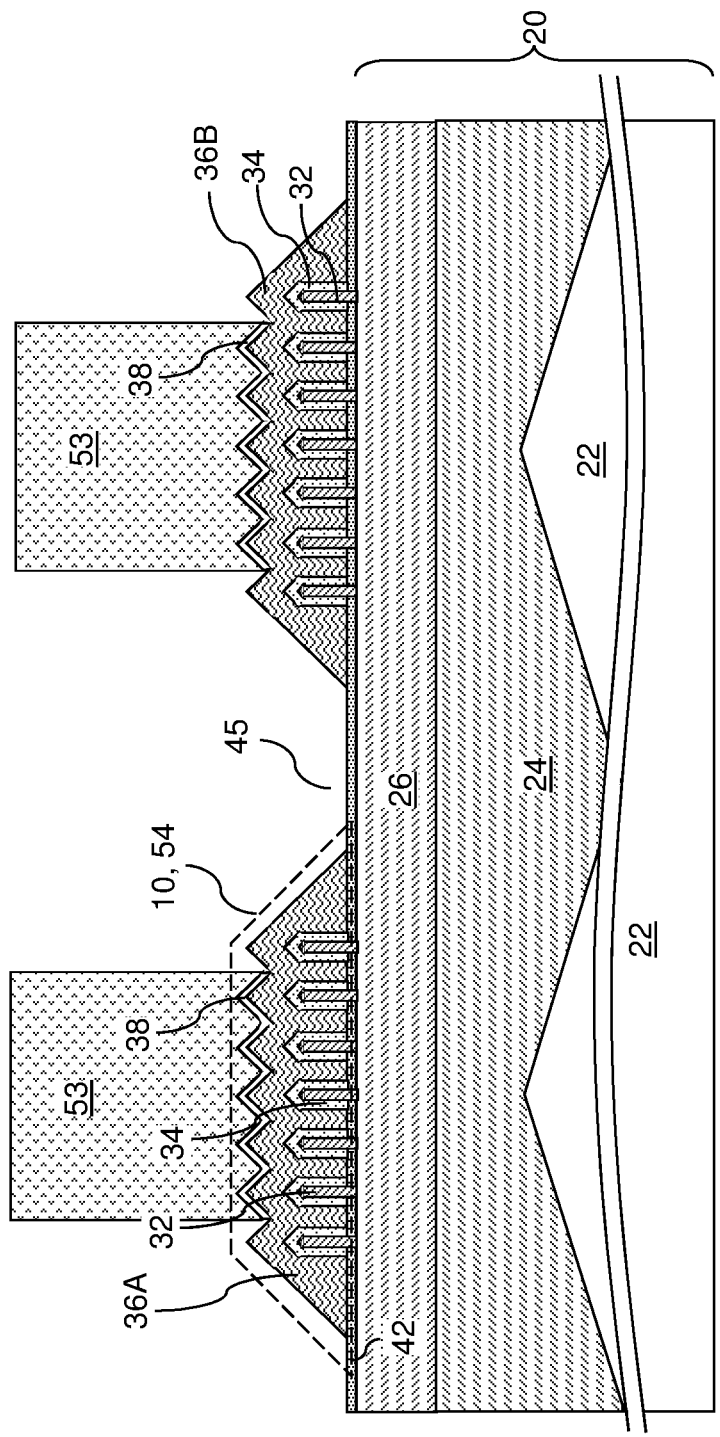
FIG. 7 is a vertical cross-sectional view of the exemplary structure after patterning the transparent conductive oxide layer according to an embodiment of the present disclosure.

Referring to FIG. 7, an optional photoresist layer 53 can be applied over the transparent conductive oxide layer 38, and can be patterned to mask at least one group of nanowires (32, 34) in each cluster 44 (i.e., in each in-process subpixel) to be incorporated into a final device structure. The photoresist layer 53 is applied over the transparent conductive oxide layer 38 and is subsequently patterned by lithographic methods (i.e., by lithographic exposure and development). An etch process can be performed to remove physically exposed portions of the transparent conductive layer 38 in the inter-cluster region 45 and optionally along the edges of each cluster 44. The photoresist layer 53 can be subsequently removed, for example, by ashing.

Patterning of the second conductivity type semiconductor material layer 36 or the semiconductor nanowires (32, 34) is unnecessary because each second conductivity type semiconductor material layer 36 defines an area (e.g., mesa structure 54) for forming a subpixel LED 10 (e.g., 10G, 10B, or 10R). Thus, each second conductivity type semiconductor material layer 36 is self-aligned to an underlying cluster 44 of semiconductor nanowires (32, 34), and is electrically isolated from other second conductive type semiconductor material layers 36 overlying other clusters 44 of semiconductor nanowires (32, 34) by the inter-cluster region 45. In other words, each continuous material layer portion (36A, 36B) of the second conductivity type semiconductor material layer 36 is a discrete material layer portion in each mesa structure 54 formed during the selective deposition step of layer 36. Each continuous material layer portion (36A, 36B) is self-aligned to a respective cluster 44 of semiconductor nanowires (32, 34) in a respective mesa structure 54. Each continuous material layer portion (e.g., 36A) is electrically isolated from other continuous material layer portions (e.g., 36B) of the second conductive type semiconductor material layer 36 overlying other clusters 44 of semiconductor nanowires by the inter-cluster regions 45 at an end of the selective deposition prior to any subsequent etching steps.

Omission of a deep etch process for patterning the second conductivity type semiconductor material layer 36 and/or the semiconductor nanowires (32, 34) provides an advantage by reducing processing time and cost. Each combination of a cluster 44 of semiconductor nanowires (32, 34), an overlying second conductivity type semiconductor material layer 36, and an optional transparent conductive layer 38 constitutes a mesa structure 54 having tapered faceted sidewalls (e.g., p-plane sidewalls of layer 36). As used herein, a "tapered" sidewall refers to any sidewall that has an angle greater than 5 degrees with respect to the vertical direction, and may have an angle greater than 10 degrees, 15 degrees, and/or 20 degrees. Each mesa structure 54 corresponds to an in-process subpixel (e.g., 10G, 10B or 10R) of the direct view display device. Thus, the subpixel size (e.g., length) is determined during the epitaxial growth of the nanowires (32, 34) and the second conductivity type semiconductor material layer 36 rather than during subsequent photolithographic patterning. This is advantageous for micro-LED subpixels having a size (e.g., length) of 1 to 5 microns, such as 2 to 4 microns, since photolithographic patterning and deep etch processes becomes harder as the subpixel size and pitch gets smaller.

Figure 8:
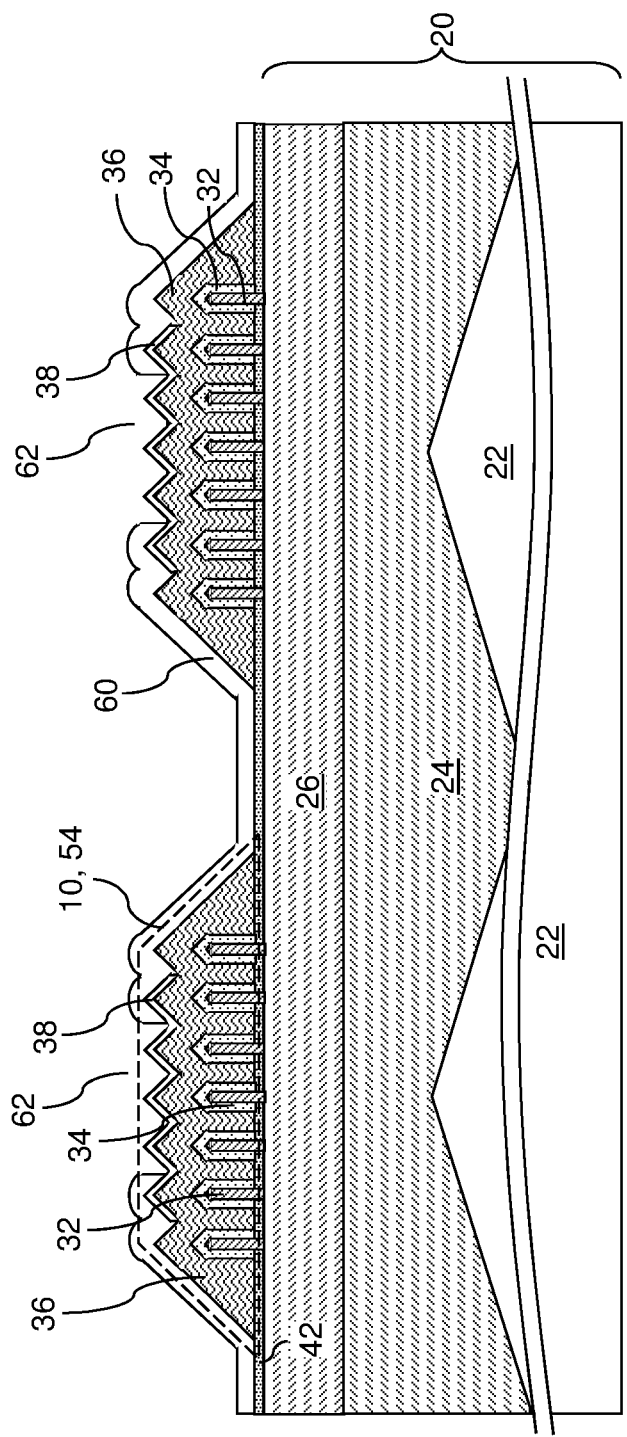
FIG. 8 is a vertical cross-sectional view of the exemplary structure after deposition and patterning of a dielectric material layer according to an embodiment of the present disclosure.

Referring to FIG. 8, an optional dielectric material layer 60 may be deposited over the transparent conductive oxide layer 38 and the second conductivity type semiconductor material layer 36. The dielectric material layer 60 includes a transparent dielectric material such as silicon oxide, silicon nitride, a dielectric metal oxide (such as aluminum oxide), organosilicate glass, or porous variants thereof. The dielectric material layer 60 can be deposited by a conformal deposition method (such as low pressure chemical vapor deposition (LPCVD) or atomic layer deposition (ALD)) or by a non-conformal deposition method (such as plasma enhanced chemical vapor deposition (PECVD) or physical vapor deposition (such as sputtering or e-beam deposition). In one embodiment, the thickness of the dielectric material layer 60 over the tapered faceted surfaces of the second conductivity type semiconductor material layer 36 can be uniform.

The dielectric material layer 60 can be formed over the mesa structure 54 (i.e., over the second conductivity type semiconductor material layer 36 and around each remaining group of nanowires (32, 34)). In one embodiment, at least one remaining group of nanowires (32, 34) in the mesa structure 54 can constitute an array of nanowires (32, 34). The dielectric material layer 60 can include a first horizontally extending portion that overlies a transparent conductive oxide layer 38 and an underlying cluster 44 of nanowires (32, 34), sidewall (i.e., non-horizontal) portions that are adjoined to the periphery of the horizontally extending portion of the dielectric material layer 60 and laterally surrounding the mesa structure 54 containing the cluster 44 of nanowires (32, 34), and a second horizontal portion located in the inter-cluster region 45 outside an area of the cluster 44 of nanowires (32, 34), overlying the top surface of the substrate 20, and adjoined to the sidewall portions of the dielectric material layer 60. The thickness of the dielectric material layer 60, as measured above a planar region such as the region outside the array of nanowires (32, 34), can be in a range from 100 nm to 4 microns, such as from 200 nm to 2 microns, although lesser and greater thicknesses can also be employed. The dielectric material layer 60 can include inner sidewalls that contact a respective one of the faceted sidewalls of the second conductivity type semiconductor material layer 36. Subsequently, openings 62 are formed in the dielectric material layer 60 exposing the underlying layer 38 (if present) or layer 36.

Figure 9:
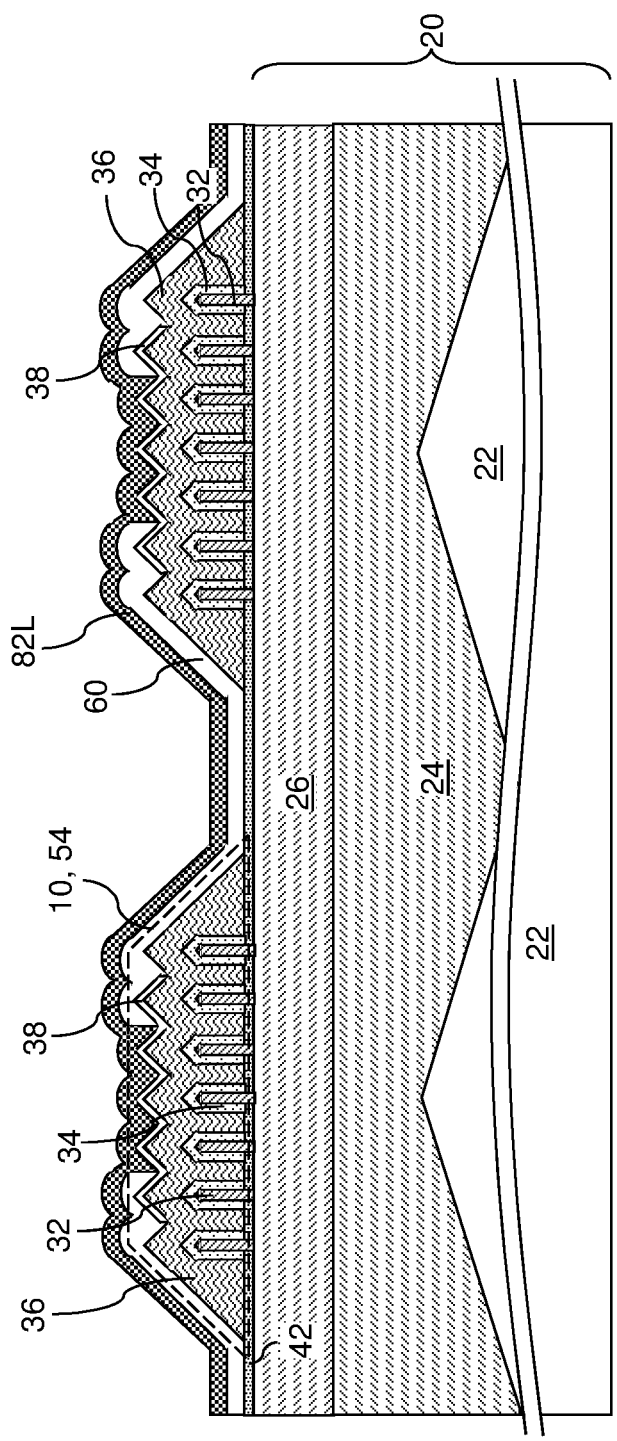
FIG. 9 is a vertical cross-sectional view of the exemplary structure after formation of a conductive reflector layer according to an embodiment of the present disclosure.

Referring to FIG. 9, a reflector material can be deposited over the dielectric material layer 60 and in the openings 62 in contact with the underlying layer 38 (if present) or layer 36. The conductive reflector layer 82L includes a reflective material such as a metal. In one embodiment, the conductive reflector layer 82L includes at least one material selected from silver, aluminum, copper, and gold. In one embodiment, the reflector material can be a thin film distributed Bragg reflector DBR with small index changes to provide better reflectivity.

In one embodiment, the reflector material can be deposited by a directional deposition method such as physical vapor deposition (sputtering) or vacuum evaporation. The thickness of horizontal portions of the conductive reflector layer 82L can be in a range from 5 nm to 500 nm, such as from 10 nm to 250 nm, although lesser and greater thicknesses can also be employed.

The conductive reflector layer 82L can have tapered sidewalls that are parallel to a respective one of the faceted sidewalls of the second conductivity type semiconductor material layer 60. The tapered sidewalls can include inner tapered sidewalls that contact outer tapered sidewalls of the dielectric material layer 60, and outer tapered sidewalls that are physically exposed. The a dielectric material layer 60 can include outer sidewalls that contact inner tapered sidewalls of the conductive reflector layer 82L.

Optionally, at least one metallic (i.e., electrically conductive) barrier layer (not shown) can be formed as at least one continuous material layer on the conductive reflector layer 82L to facilitate subsequent bonding of a solder material over the mesa structures. The at least one metallic barrier layer includes a metal or metal alloy (i.e., metallic) material layers that can be employed for under-bump metallurgy (UBM), i.e., a set of metal layers provide between a conductive bonding structure and a die. In one embodiment, the at least one metallic barrier layer can include a diffusion barrier layer and an adhesion promoter layer. Exemplary materials that can be employed for the diffusion barrier layer include titanium, titanium-tungsten, titanium-platinum or tantalum. Exemplary materials that can be employed for the adhesion promoter layer include tungsten, platinum, or a stack of tungsten and platinum. Any other under-bump metallurgy known in the art can also be employed.

Figure 10:
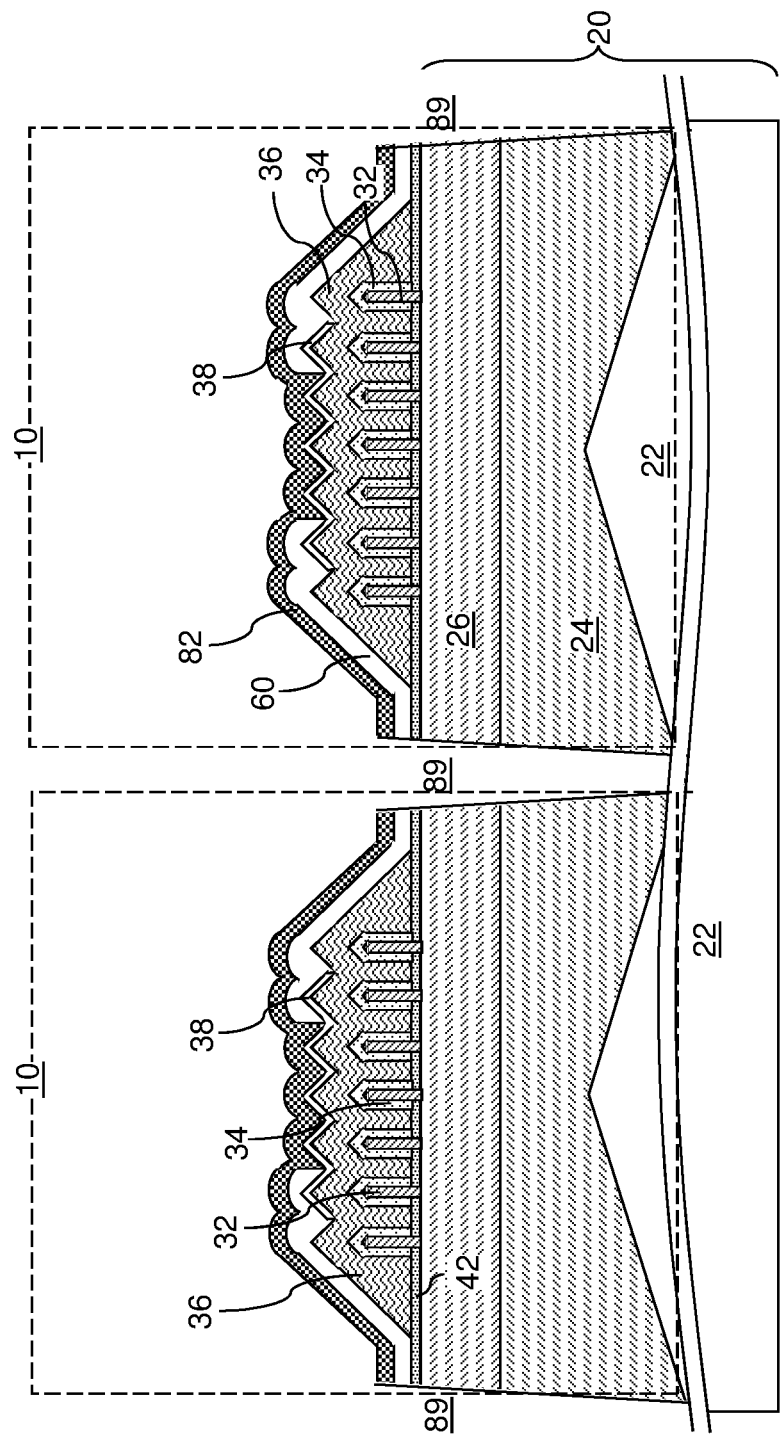
FIG. 10 is a vertical cross-sectional view of the exemplary structure after formation of moat trenches according to an embodiment of the present disclosure.

Referring to FIG. 10, moat trenches 89 are formed in the inter-cluster regions 45 through the conductive reflector layer 82L, the dielectric material layer 60, the growth mask layer 42, the doped compound semiconductor layer 26, and the buffer layer 24 around each region including an array of nanowires (32, 34). The moat trenches 89 can be formed, for example, by masking each mesa structure with a mask layer (not shown) and by anisotropically etching portions of the conductive reflector layer 82L, the dielectric material layer 60, the growth mask layer 42, the doped compound semiconductor layer 26, and the buffer layer 24 around each region including an array of nanowires (32, 34) that are not masked by the masking layer. The etch process can include at least one anisotropic etch process such that sidewalls of the doped compound semiconductor layer 26 and the buffer layer 24 that are formed by the at least one anisotropic etch process have a taper angle with respect to the vertical direction that is perpendicular to the top surface of the substrate 20. The taper angle can be in a range from 3 degrees to 30 degrees. Each remaining portion of the conductive reflector layer 82L constitutes a conductive reflector 82. There is no need to etch layer 36 at this step because layer 36 is epitaxially grown self aligned to the clusters 44 of the nanowires, such that layer 36 is not present in the inter-cluster region 45 which is devoid of the nanowires. In another embodiment, if each active shell 34 emits light of a different color, as in the embodiment of FIG. 1A, then this etch process is conducted only in the inter-pixel regions between pixels 25, but not in the inter-cluster regions 45 which are located between in-process subpixels.

In one embodiment, the masking layer can be a photoresist layer or a polyimide layer. The patterned mask layer covers each combination of the mesa structure 54 containing the cluster 44 of nanowires (32, 34), while the inter-cluster regions 45 between neighboring clusters 44 of nanowires (32, 34) are physically exposed. A series of anisotropic etch processes can be employed to form the moat trenches 89 while the patterned mask layer protects the underlying array of nanowires (32, 34) and layer 36. In one embodiment, the support substrate 22 can be employed as an etch stop layer for the last anisotropic etch process among the at least one anisotropic etch process. The masking layer (if present) can be subsequently removed, for example, by ashing. Each continuous set of elements laterally surrounded by the moat trenches 89 constitutes a discrete die (24, 26, 42, 32, 34, 36, 38, 60, 82) of light emitting devices (LEDs) 10 (i.e., the moat trenches 89 separate adjacent LEDs 10 which comprise subpixels 10G, 10B or 10R). The LEDs 10 are attached to the support substrate 22 at this step, and are transferred to a backplane at a subsequent step. Upon transfer onto the backplane, each LED 10 can be employed as a subpixel (10G, 10B or 10R) of a direct view display device. Each LED 10 can emit light of the same or different color. For example, the LEDs 10 can be blue light emitting LEDs 10B, green light emitting LEDs 10G or red light emitting LEDs 10R (which are shown in FIG. 1A) or single color LEDs (e.g., 10G shown in FIG. 1B). Thus, an array of dies can be transported while being attached to the support substrate 22 for further processing. Each LED 10 comprising each mesa structure 54 comprises a subpixel (e.g., 10G, 10B or 10R) that has a length (i.e., horizontal dimensional) of 1 to 100 microns, such as micro-LED having a length of 1 to 5 microns, for example 2 to 4 microns.

Figure 11:
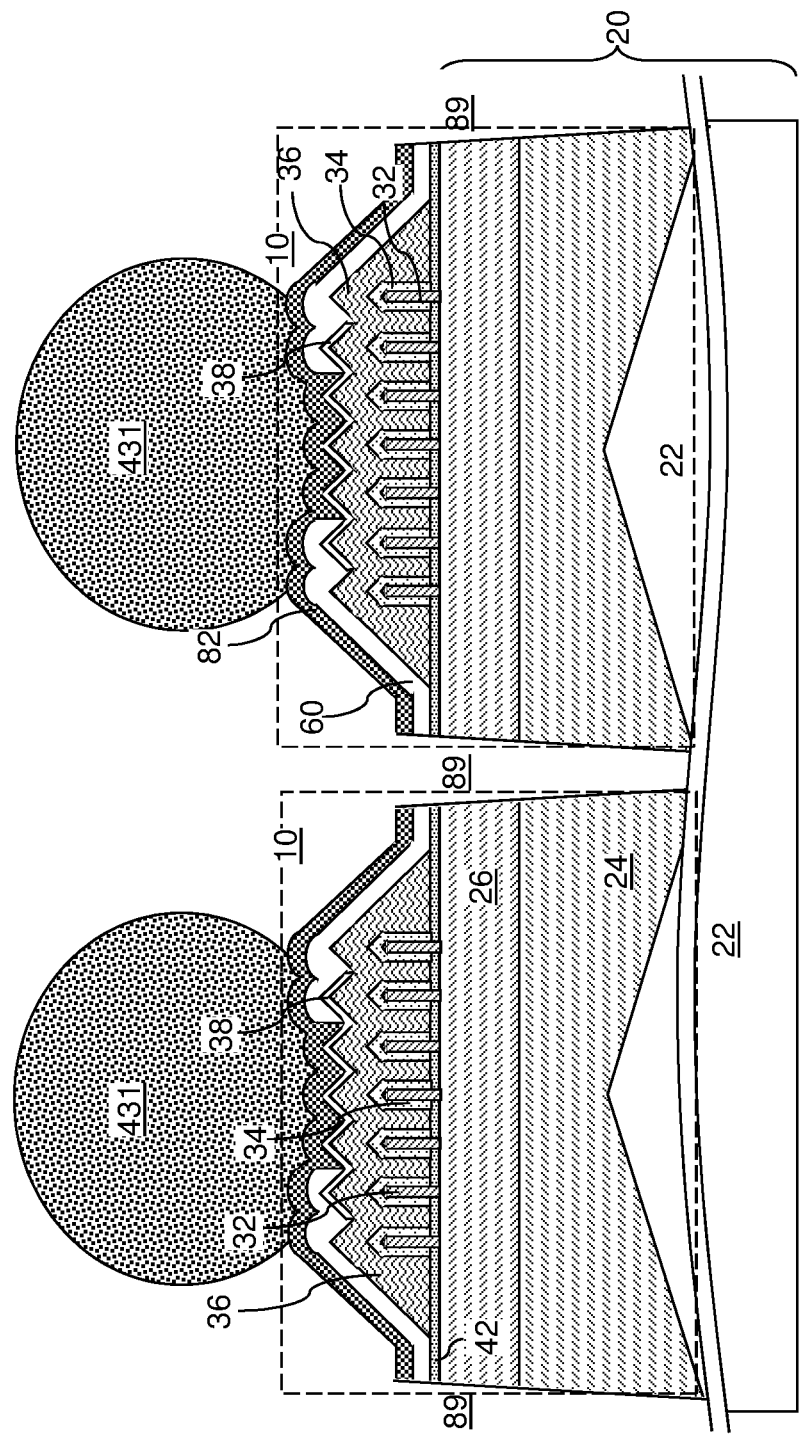
FIG. 11 is a vertical cross-sectional view of the exemplary structure after bonding a conductive bonding structure to each subpixel according to an embodiment of the present disclosure.

Referring to FIG. 11, a conductive bonding structure 431 is formed over each mesa structure. In one embodiment, the conductive bonding structures 431 can be formed directly on the at least one metallic barrier layer overlying each conductive reflector 82. The conductive bonding structures 431 include a solder material, which can include tin, and optionally includes an alloy of tin and silver, gold, copper, bismuth, indium, zinc, and/or antimony. The conductive bonding structures 431 can be formed as solder balls, or can be formed as a layer stack including at least one solder material. The conductive bonding structures 431 before or after forming the moat trenches 89. In case the conductive bonding structures 431 are formed as a layer stack including at least one solder material, formation of the moat trenches 89 can be performed after application of a continuous layer stack including at least one solder material such that each patterned layer stack of the at least one solder material can be physically separated from one another after formation of the moat trenches 89.

Figure 12:
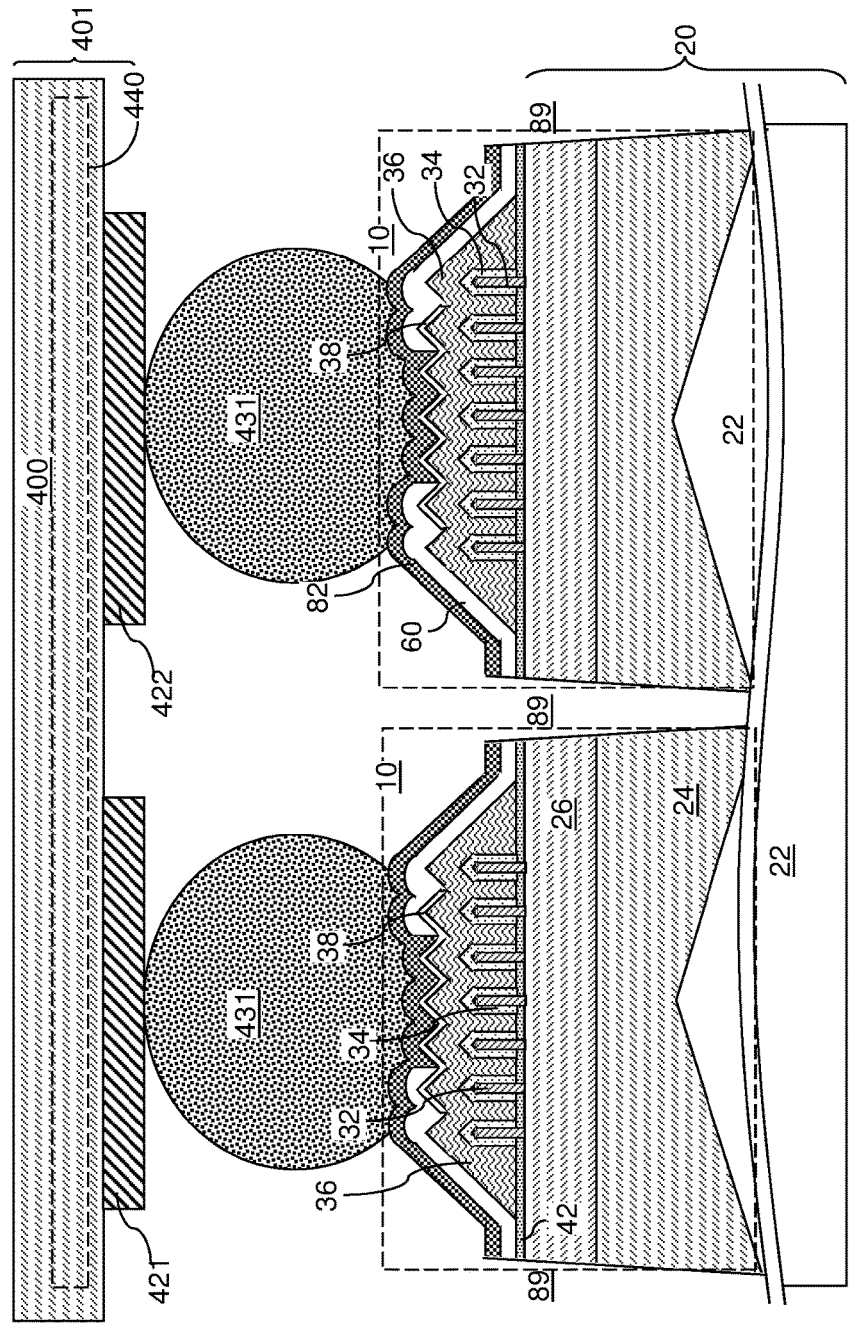
FIG. 12 is a vertical cross-sectional view of the exemplary structure after disposing a backplane with bonding structures in contact with the conductive bonding structures on the subpixels according to an embodiment of the present disclosure.

Referring to FIG. 12, a backplane 401 is provided, which includes a backplane substrate 400 and bonding structures (421, 422) located thereupon. A backplane can be an active or passive matrix backplane substrate for driving light emitting devices. As used herein, a "backplane substrate" refers to any substrate configured to affix multiple devices thereupon. The backplane substrate 400 is a substrate onto which various devices (e.g., LEDs) can be subsequently transferred. In one embodiment, the backplane substrate 400 can be a substrate of silicon, glass, plastic, and/or at least other material that can provide structural support to the devices to be subsequently transferred thereupon. In one embodiment, the backplane substrate 400 may be a passive backplane substrate, in which metal interconnect structures 440 comprising metallization lines are present, for example, in a criss-cross grid. In some embodiments, active device circuits (such as field effect transistors) may not be present in the backplane substrate 400. In another embodiment, the backplane substrate 400 may be an active backplane substrate, which includes metal interconnect structures 440 as a criss-cross grid of conductive lines and further includes a device circuitry at one or more intersections of the criss-cross grid of conductive lines. The device circuitry can comprises one or more transistors.

The backplane substrate 400 is disposed facing the substrate 20 (e.g., above, below or side-to-side) and aligned such that the conductive bonding structures 431 face, and contact, a respective one of the bonding structures (421, 422).

Figure 13:
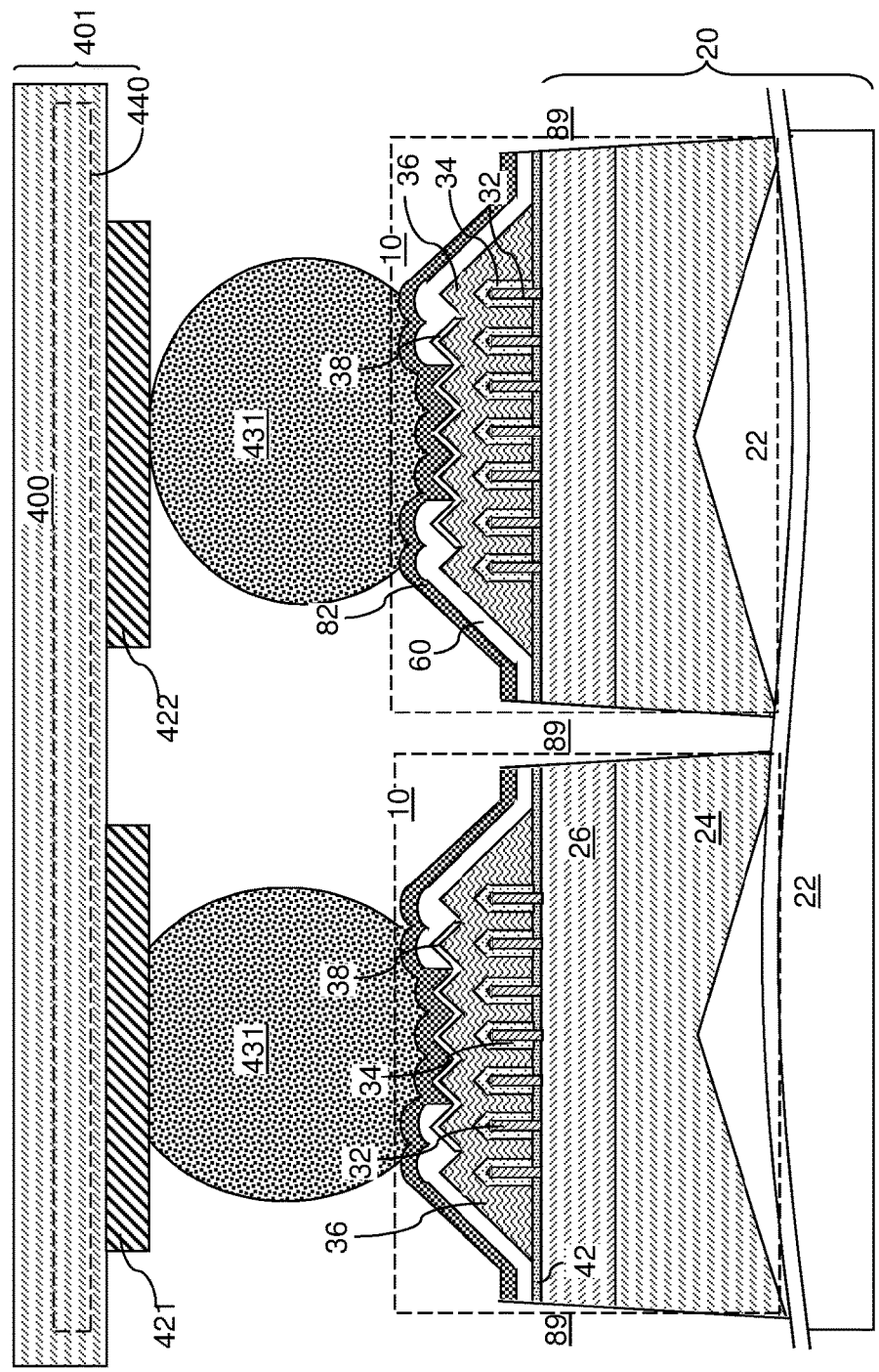
FIG. 13 is a vertical cross-sectional view of the exemplary structure after bonding subpixels to the backplane according to an embodiment of the present disclosure.

Referring to FIG. 13, at least one of the LEDs 10 (i.e., at least one subpixel 10G, 10B or 10R) can be attached to the backplane 401 by inducing bonding between a respective pair of a conductive bonding structure 432 and a bonding structure 421 (which may be a bonding pad) on the backplane 401. Local heating (for example, by laser irradiation)

of the respective pair of the conductive bonding structure 432 and the bonding structure 421 can be employed to induce reflow and bonding of the solder material. All, or only a subset, of the LEDs 10 on the substrate 20 can be bonded to the backplane 401, as will be described in more detail below with respect to FIGS. 16A to 16P.

Figure 14:
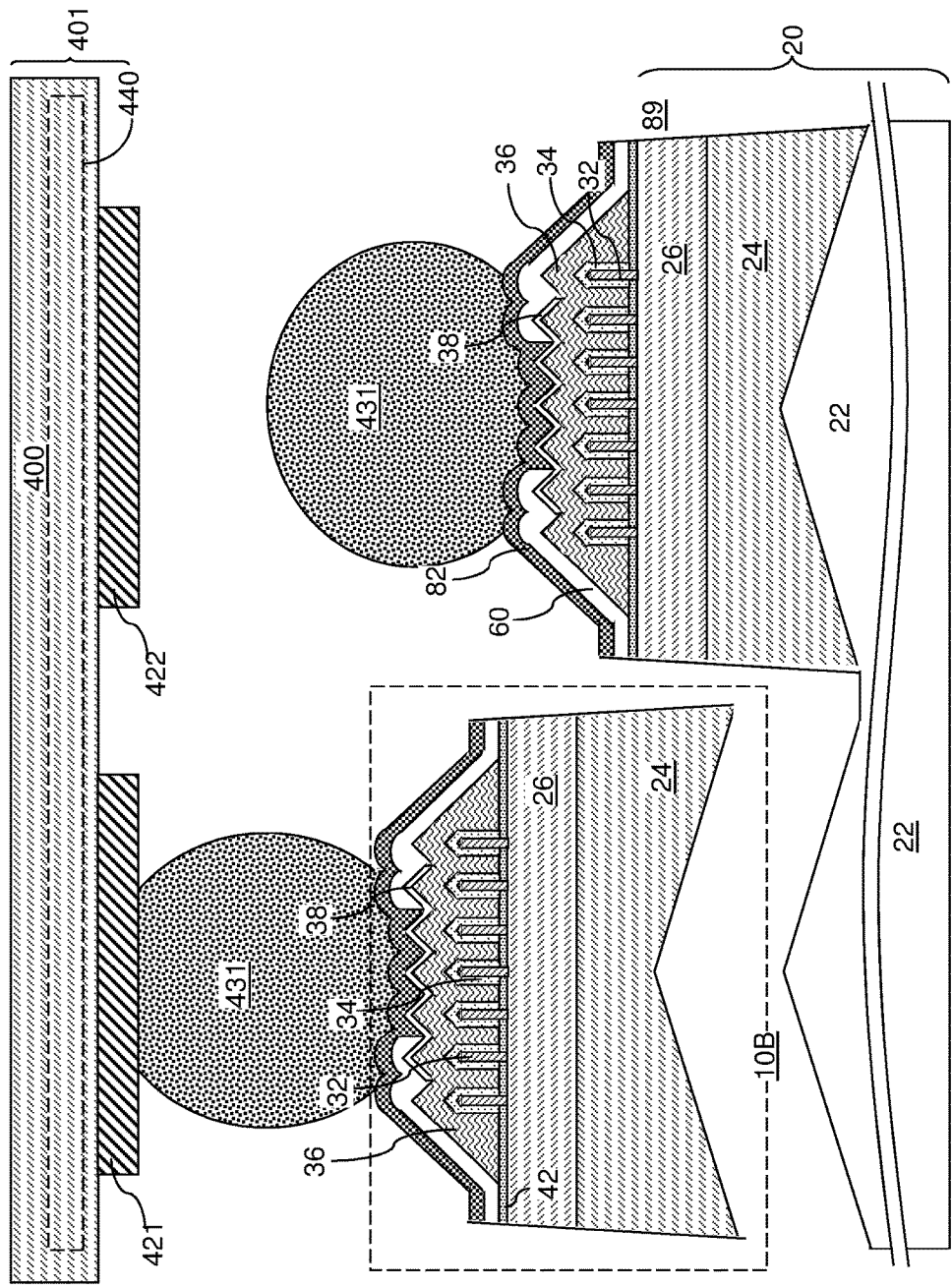
FIG. 14 is a vertical cross-sectional view of the exemplary structure after detaching a bonded subpixel from a growth substrate according to an embodiment of the present disclosure.

Referring to FIG. 14, the LEDs 10 (e.g., the blue LED subpixels 10B) that are attached to the backplane 401 can be selectively detached from the handle substrate 22. For example, laser irradiation from the side of the support substrate 22 can be employed to heat the surface portions of the buffer layer 24 that are proximal to the support substrate 22. The wavelength of the laser beam is selected such that the support substrate 22 is transparent at the wavelength of the laser beam and the material of the bottom portion of the buffer layer 24 is absorptive at the wavelength of the laser beam. For example, if the support substrate 22 includes sapphire and if the buffer layer 24 includes GaN, the wavelength of the laser beam can be in a range from 150 nm to 350 nm, which corresponds the photon energy of about 3.5 eV to 8.2 eV. The laser beam can sequentially irradiate the back side of each die so that the dies are attached only to the backplane 401, and are not attached to the support substrate 22. The support substrate 22 can be detached from the LEDs 10 by pulling the support substrate 22 and the LEDs 10 apart, as shown in FIG. 14 and as will be described in more detail below in FIGS. 16A-16P.

Figure 15A:
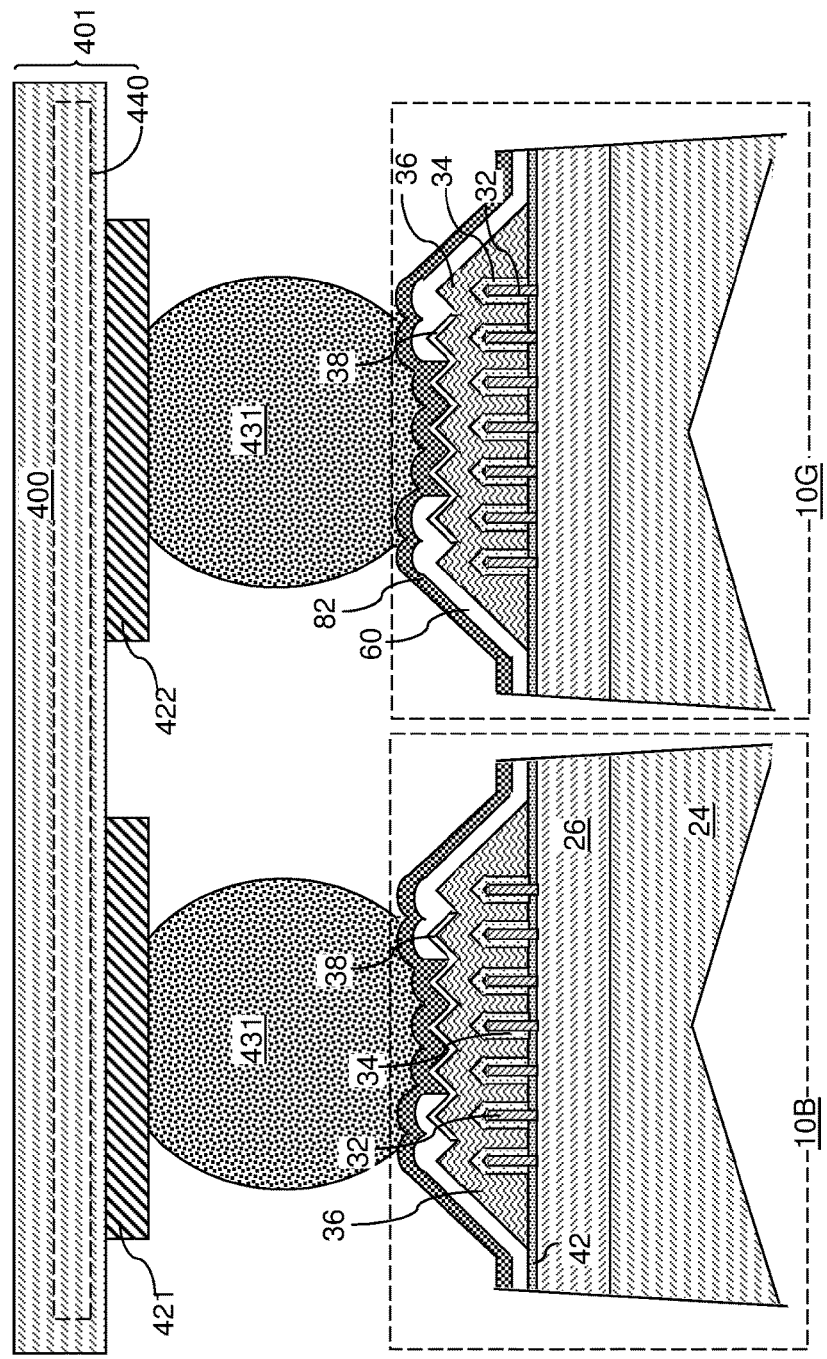
FIG. 15A is a vertical cross-sectional view of the exemplary structure after attaching an additional subpixel according to an embodiment of the present disclosure.
Figure 16A:
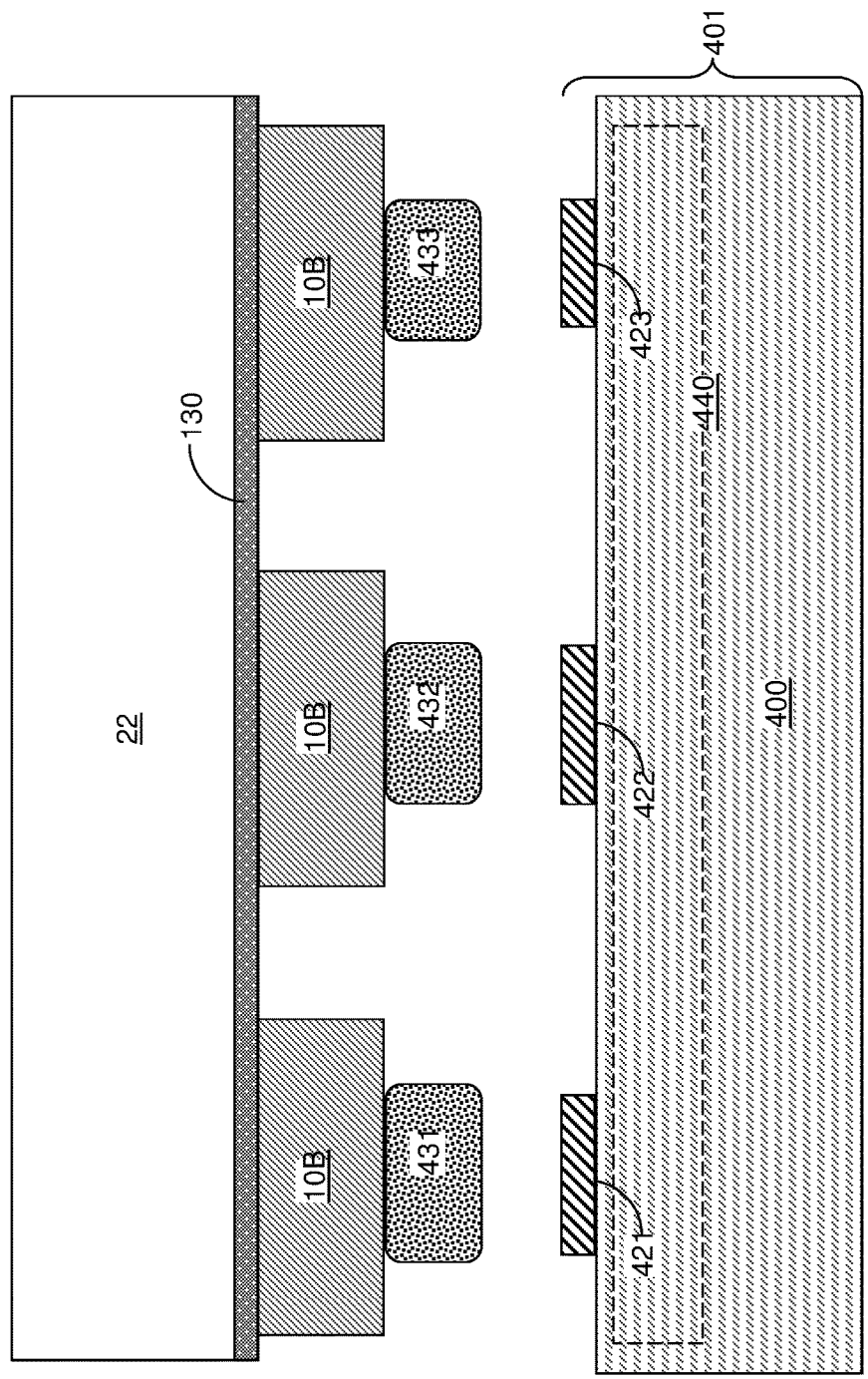
FIGS. 16A to 16P are schematic vertical cross-sectional views of steps in a method of incorporating LEDs into a display panel according to an embodiment of the present disclosure.

Referring to FIG. 15A, additional light emitting diodes (e.g., green emitting subpixels 10G) may be transferred to the backplane 401 employing the methods to be described in FIGS. 16A-16P. In one embodiment, the backplane 401 can be a display substrate (e.g., frame) for a direct view display device, and each pixel of the direct view display device may include at least one red-light emitting diode 10R configured to emit light at a peak wavelength in a range from 620 nm to 750 nm, at least one green-light emitting diode 10G configured to emit light at a peak wavelength in a range from 495 nm to 570 nm, and at least one blue-light emitting diode 10B configured to emit light at a peak wavelength in a range from 450 to 495 nm. FIG. 15A illustrates a region including a blue subpixel (i.e., a blue-light emitting diode 10B) and a green subpixel (i.e., a green-light emitting diode 10G).

Figure 15B:
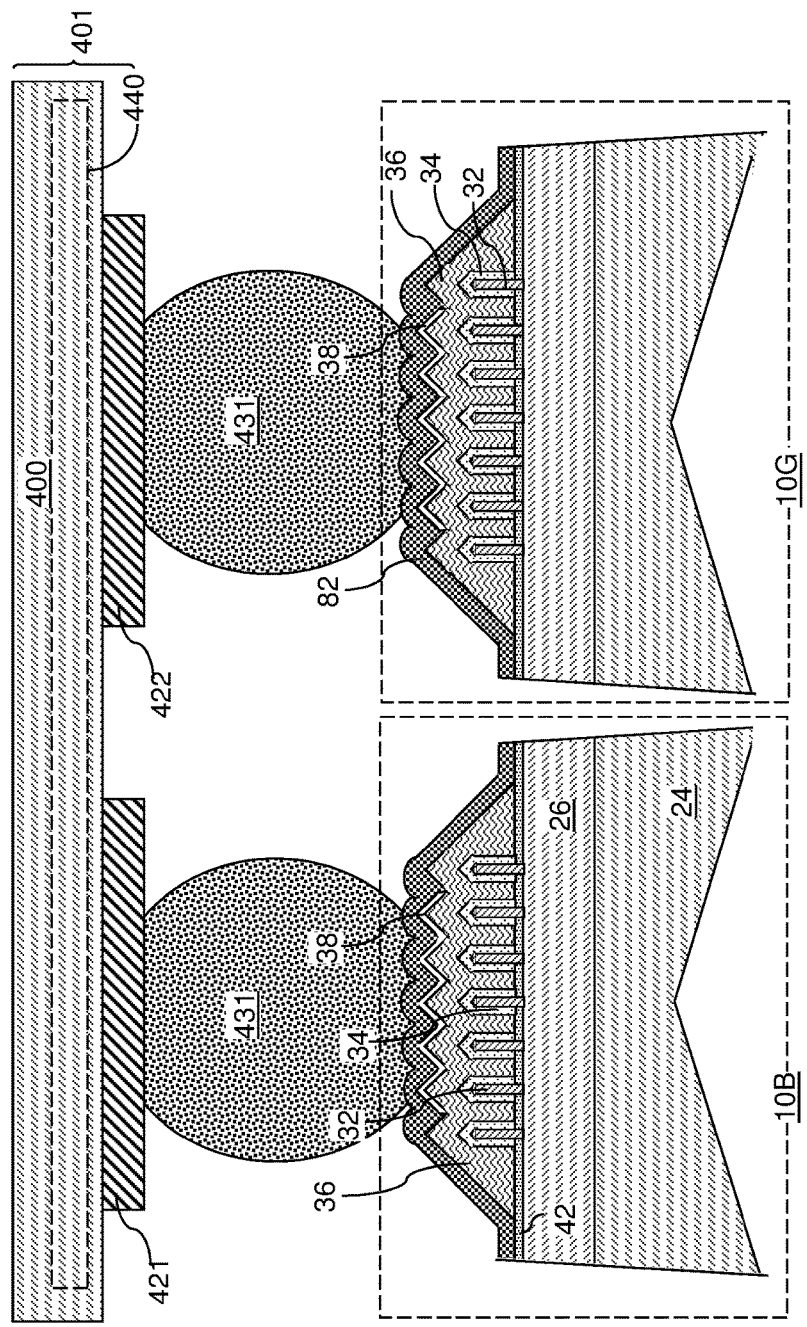
FIG. 15B is a vertical cross-sectional view of an alternative embodiment of the exemplary structure according to an embodiment of the present disclosure.

FIG. 15B illustrates an alternative embodiment in which the dielectric material layer 60 is omitted. The second conductivity type semiconductor material layer 36 contacts the conductive reflector 82 in this embodiment.

Each LED 10 die is subpixel (10B, 10G or 10R) that emits light of a given color, which may be, for example, blue, green, or red. FIGS. 16A-16P illustrate a method of incorporating the LEDs 10, such as a blue, green and/or red light emitting subpixels (10B, 10G, 10R) into a single pixel of direct view display from different growth substrates 20 shown in FIG. 1B. The LEDs 10 can be the nanowire LEDs described above, different nanowire LEDs and/or bulk (i.e., planar) LEDs. Each of the pixels comprises a red-light emitting diode 10R configured to emit light at a peak wavelength in a range from 620 nm to 750 nm, a green-light emitting diode 10G configured to emit light at a peak wavelength in a range from 495 nm to 570 nm, and a blue-light emitting diode 10B configured to emit light at a peak wavelength in a range from 450 nm to 495 nm.

Referring to FIG. 16A, an in-process structure is illustrated, which can be employed to form an exemplary light emitting device assembly (e.g., direct view display) according to an embodiment of the present disclosure.

In this embodiment, the backplane substrate 400 may have a substantially planar (i.e., not stepped) upper surface or a stepped upper surface. The bond pads (421, 422, 423) can have the same height or different heights. The conductive bonding structures (431, 432, 433) can have the same height or different heights. The exemplary light emitting device assembly can include the same thickness bonding pads (421, 422, 423) for the respective first, second and third LEDs (10B, 10G, 10R) and the same height for the conductive bonding structures (431, 432, 433). The bond pads (421, 422, 423) can have the same or different composition as each other. The conductive bonding structures (431, 432, 433) can have the same or different composition as each other.

In one embodiment, the conductive bonding structures (431, 432, 433) can be formed on the LEDs 10 to be transferred to the backplane 401. For example, first light emitting diodes 10B can be the first devices to be transferred to the backplane substrate 400. The first light emitting diodes 10B can be located on first support substrate 22, which can be a first transfer substrate or a first-type growth substrate. The conductive bonding structures 431 are formed on a first subset of the first light emitting diodes 10B, for example as described above and include the conductive bonding structure 431. The second conductive bonding structures 432 are formed on a second subset of the first light emitting diodes 10B and the third conductive bonding structures 433 are formed on a third subset of the first light emitting diodes 10B.

In one embodiment, the conductive bonding structures (431, 432, 432) can be substantially spherical, substantially ellipsoidal, or substantially cylindrical. The maximum horizontal dimension (such as the diameter of a spherical shape or a cylindrical shape) of each conductive bonding structures (431, 432, 433) can be in a range from 0.25 microns to 100 microns (such as from 0.5 microns to 1 micron), although lesser and greater maximum horizontal dimensions can also be employed.

Figure 16B:
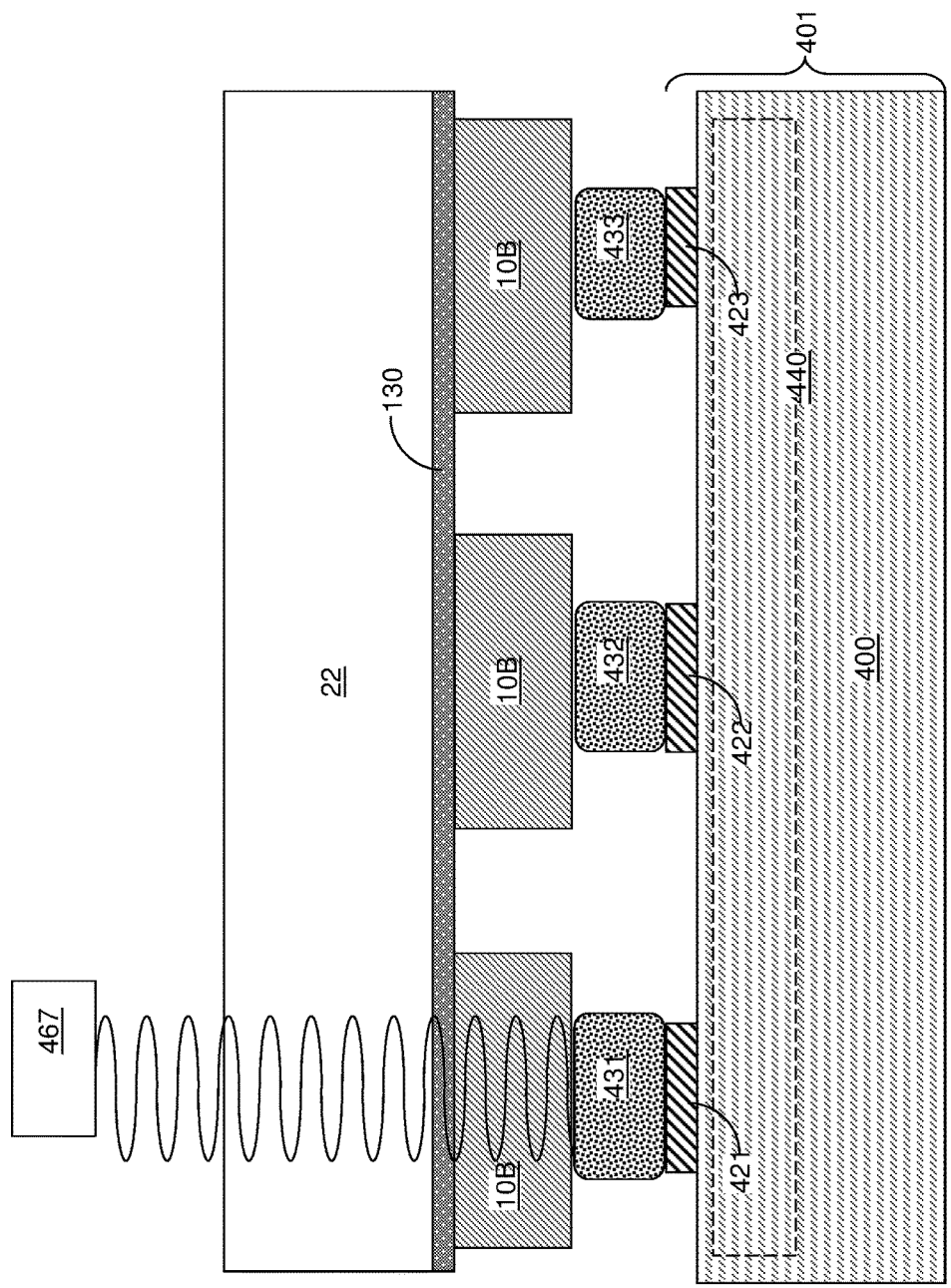

Referring to FIG. 16B, the backplane 401 and the assembly including the first light emitting diodes 10B are positioned such that each conductive bonding structure 431 is attached to one first LED 10B, and contacts the respective bonding pad 421. Each second conductive bonding structure 432 can be attached to the another first LED 10B and contacts the second bonding pad 422. Each third conductive bonding structure 433 is attached to yet another first LED 10R and contacts the third bonding pad 423.

A heating laser 467 can be employed to reflow the first conductive bonding structures 431. The heating laser 467 can have a wavelength that induces greater absorption of energy within the material of the conductive bonding structures (431, 432, 433) than within the materials of the support substrate 22 or within the materials of the devices to be transferred (e.g., the first LEDs 10B). For example, the heating laser 467 can have a wavelength in a range from 0.8 micron to 20 microns, such as 1 to 2 microns, to provide a differential heating between the material of the conductive bonding structures 431 which are to be reflowed and the material of the conductive bonding structures 432, 433 which are not to be reflowed. Differential heating is also provided between the conductive bonding structures 431 and the materials of the support substrate 22 and the devices to be transferred. The first conductive bonding structures 431 can be selectively heated by sequential irradiation of a laser beam from the heating laser 467 to reflow each first conductive bonding structure 431, and to bond each first conductive bonding structure 431 to an overlying first LED 10B and to an underlying first bonding pad 421. Preferably, the laser beam is provided through the support substrate 22. The laser beam may be transmitted through the support substrate 22 and through the devices to the conductive reflector layer 82 which absorbs the laser beam and heats the adjacent conductive bonding structures 431 for selective heating and reflow. Alternatively, the laser beam may be absorbed by the support substrate or the device adjacent to the conductive bonding structures 431 to selectively heat and reflow the conductive bonding structures 431 without reflowing the remaining conductive bonding structures (432, 433).

Figure 16C:
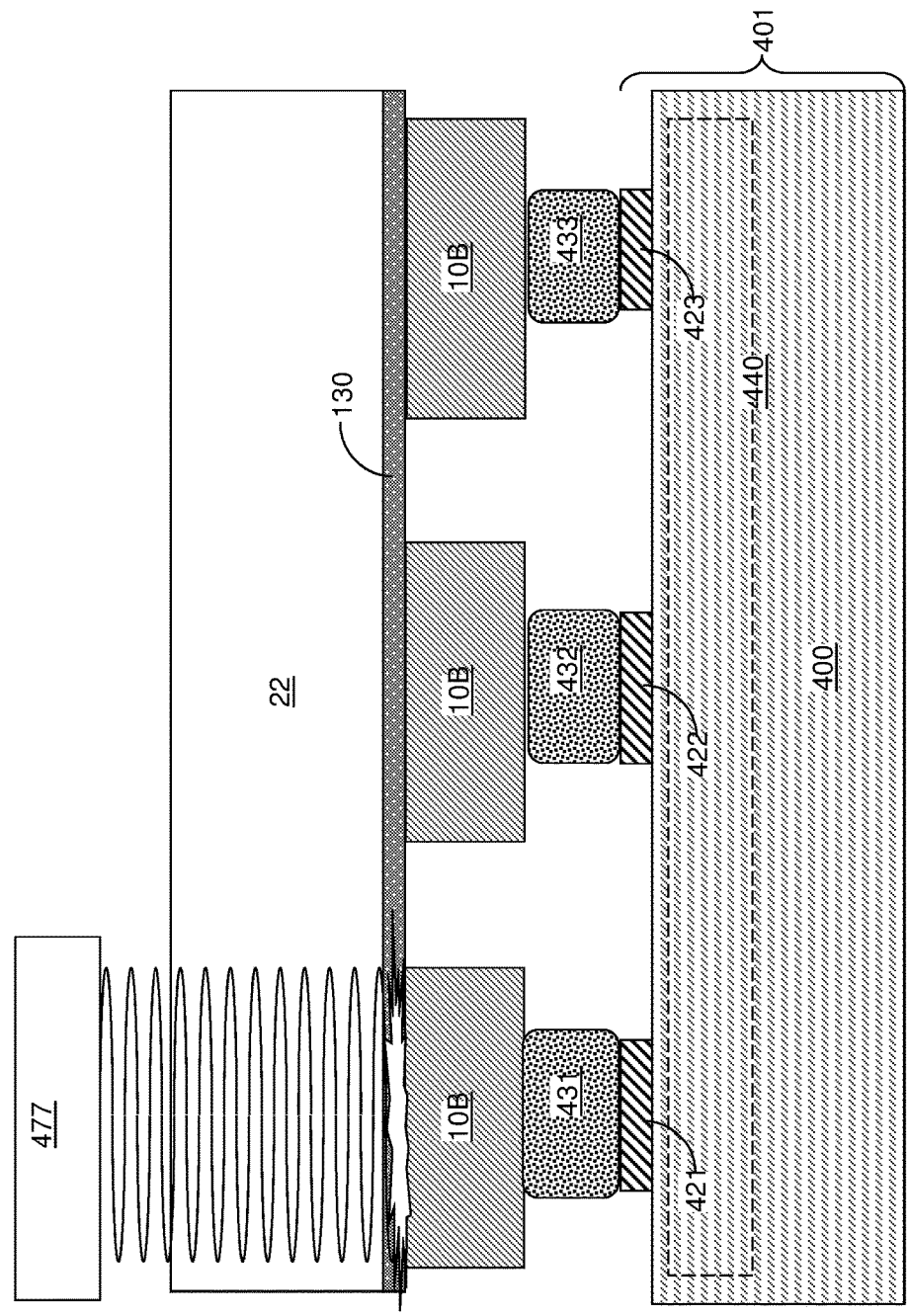

Referring to FIG. 16C, a laser irradiation process is performed to separate each bonded first LED 10B from the first support substrate. The wavelength of the laser 477 (which is herein referred to an "ablation laser") can be different (e.g., shorter) from the wavelength of the heating laser 467, for example between 0.1 and 0.75 micron, such as 0.25 to 0.5 micron. The laser provides more heating to the material of the ablation material layer 130 than to the materials of the support substrate 22 and the transferred devices (e.g., the first light emitting diodes 10B). The ablation material layer 130 may comprise the semiconductor buffer layer 24 (e.g., gallium nitride layer) described above or another material, such as a laser radiation absorptive insulating release layer (e.g., silicon rich silicon nitride layer). Each portion of the ablation material layer 130 overlying the first conductive bonding structures 431 can be sequentially irradiated by a laser beam from the laser 477 to dissociate each underlying first LED 10B.

Figure 16D:
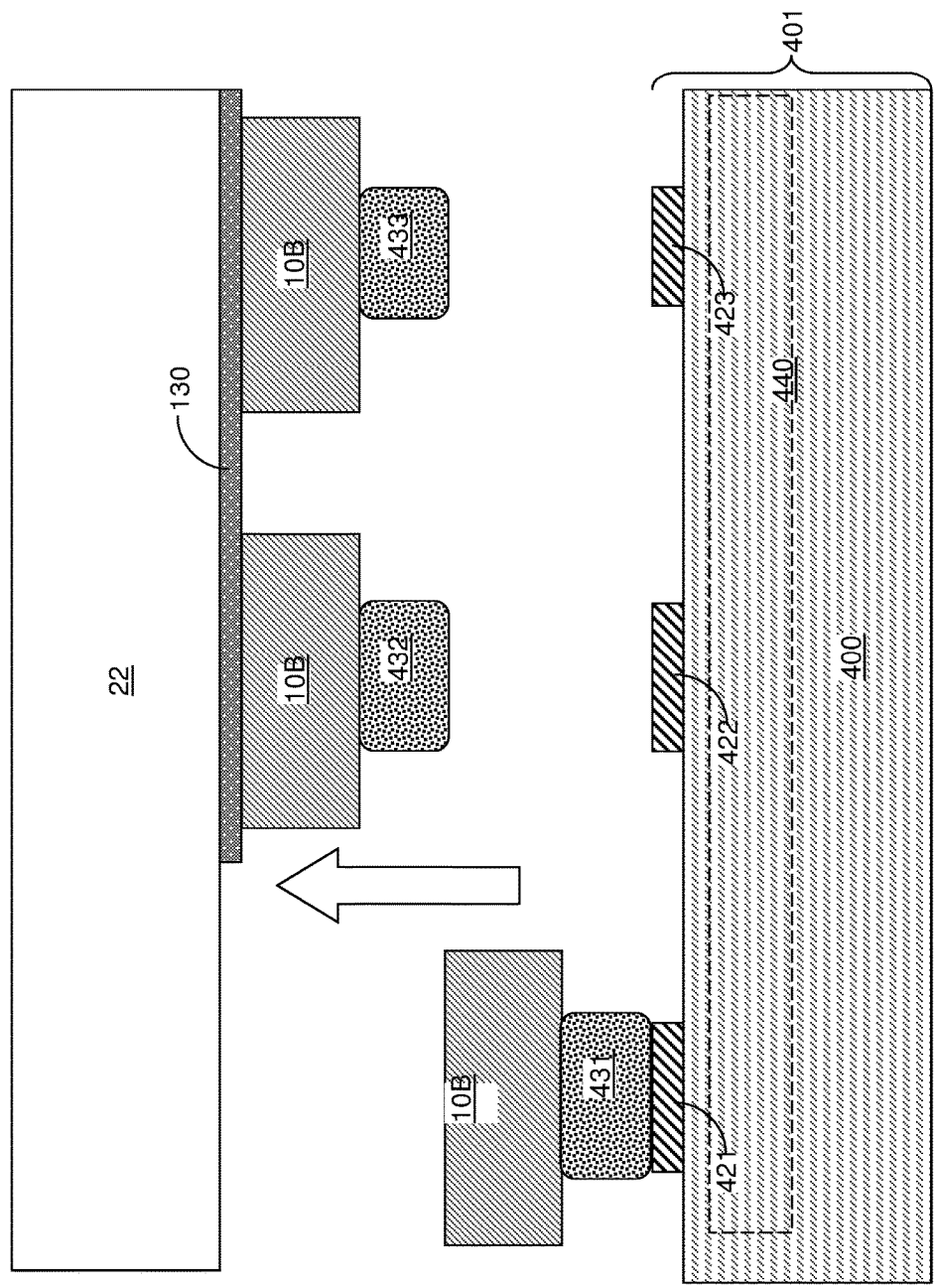

Referring to FIG. 16D, the assembly of the first support substrate 22 and attached first light emitting diodes 10B (i.e., the complement of the first subset of the first light emitting diodes 10B) is separated from the backplane 401 and the first subset of the first light emitting diodes 10B.

Figure 16E:
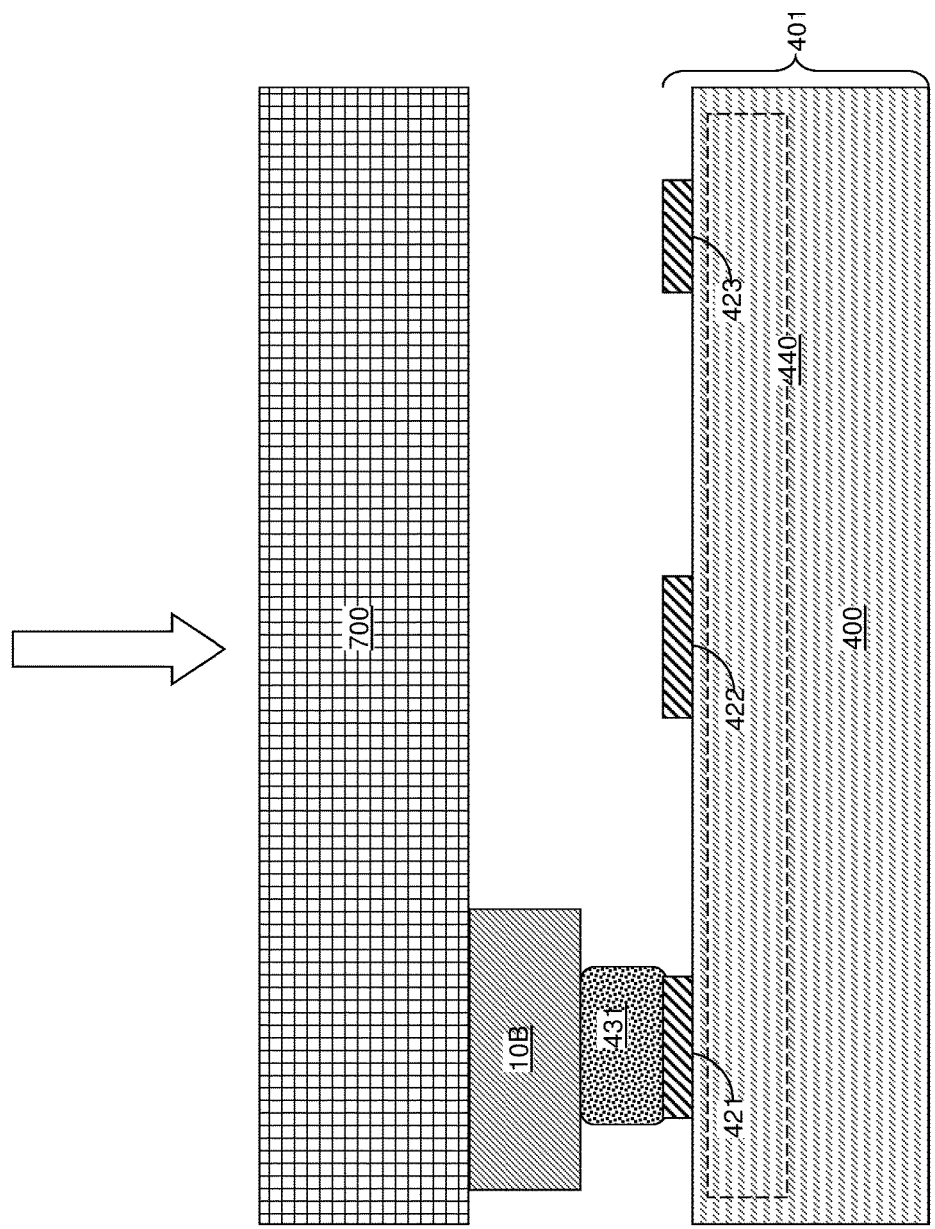

Referring to FIG. 16E, a dummy substrate 700 can employed to push the first light emitting diodes 10B on the first conductive bonding structures 431 toward the backplane 401 while optionally thermally reflowing the first conductive bonding structures 431. The compressible first conductive bonding structures can be compressed by 5 to 20% of their thickness during this step.

Figure 16F:
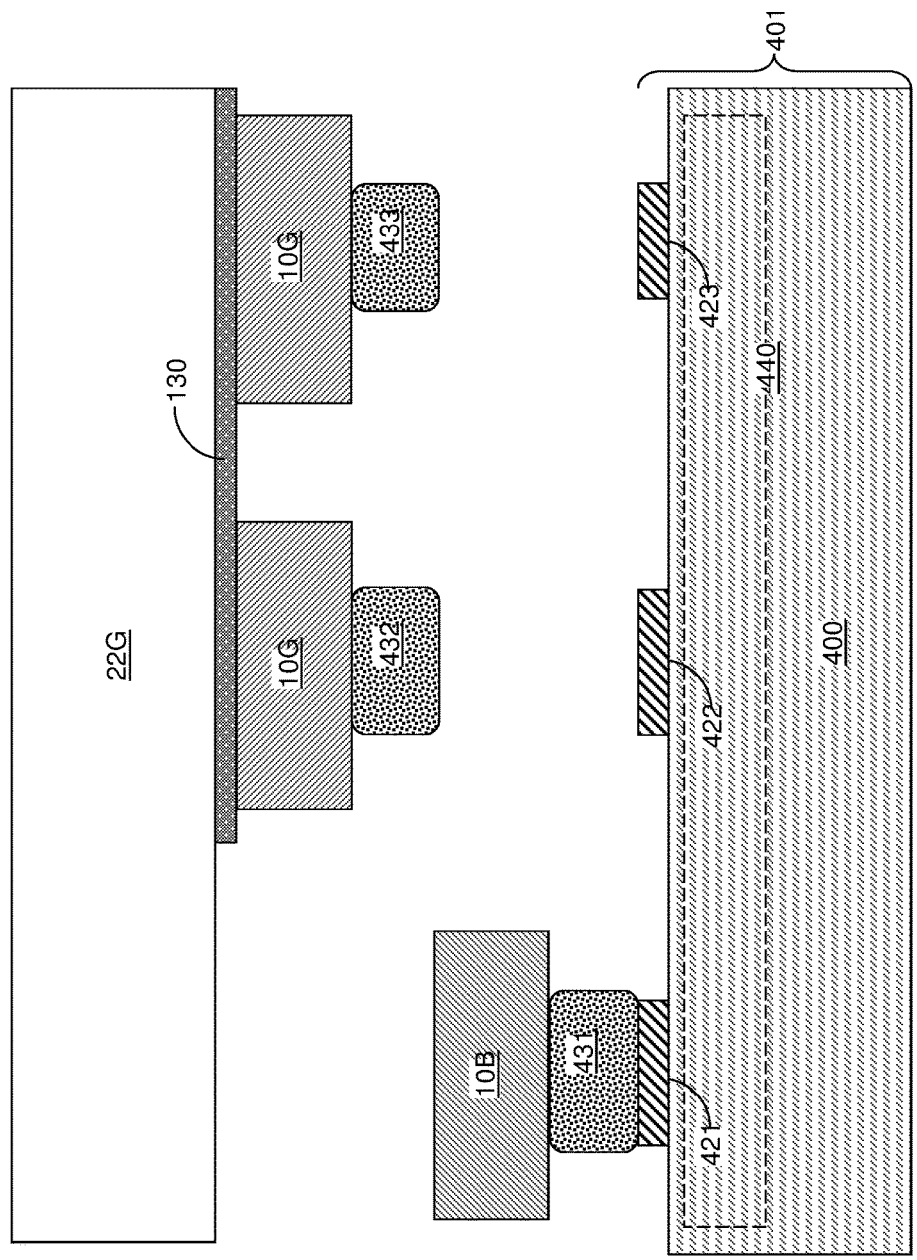

Referring to FIG. 16F, a second support substrate (such as a second growth or transfer substrate) 22G from which a first subset of second LEDs 10G are removed is positioned over the in-process exemplary light emitting device assembly, and is aligned such that a second subset of the second light emitting diodes 10G overlies the second bonding pads 422.

Figure 16G:
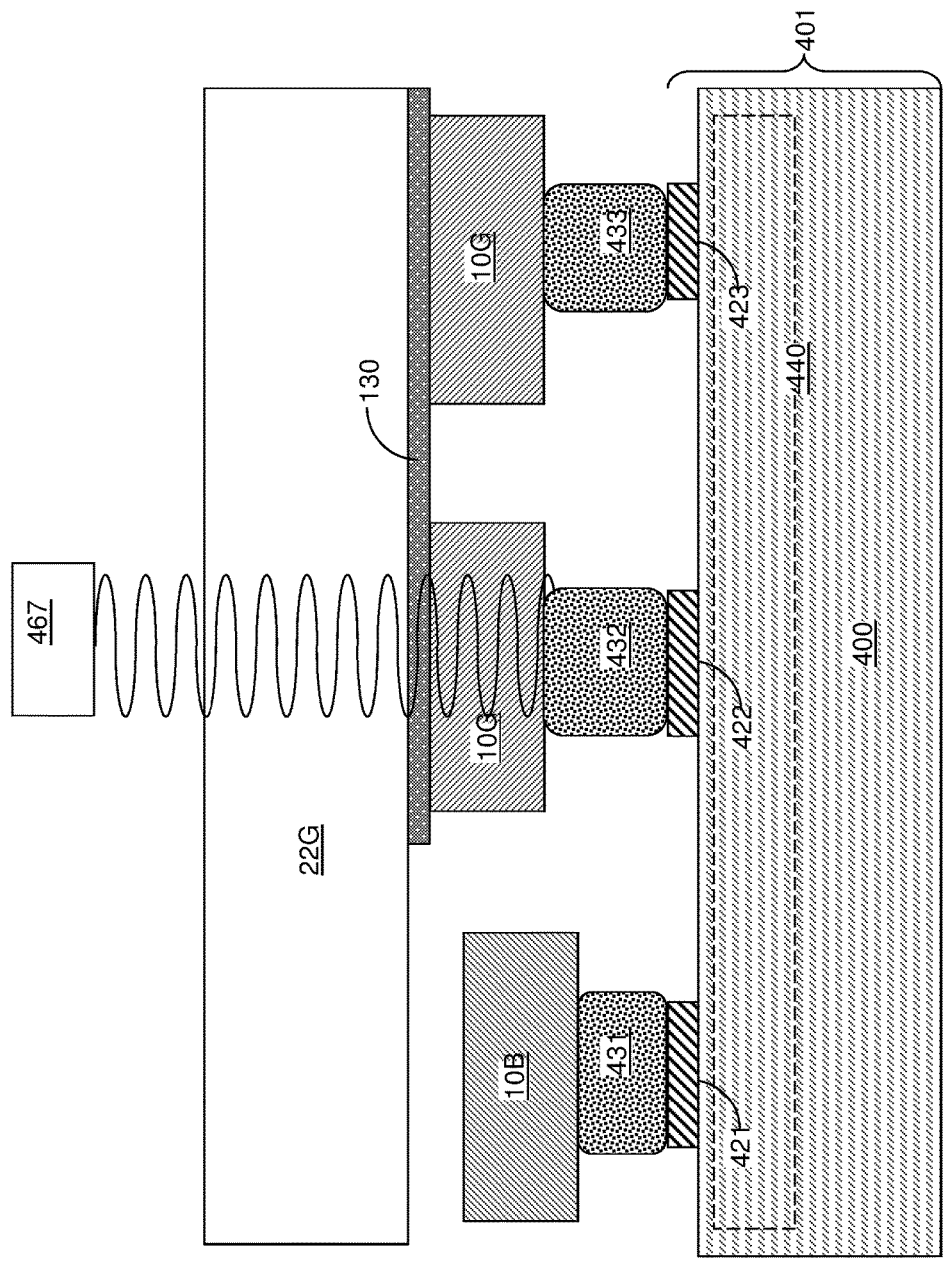

Referring to FIG. 16G, the backplane 401 and the assembly including the second light emitting diodes 10G are positioned such that each second conductive bonding structure 432 is attached to the second LED 10G and contacts the second bonding pad 422.

In one embodiment, each second conductive bonding structure 432 can be attached to one of an overlying second LED 10G, and the second bonding pad 422, and each third conductive bonding structure 433 can be attached to one of an overlying second LED 10G and contacts the third bonding pad 423.

A heating laser 467 is employed to reflow the second conductive bonding structures 432 without reflowing the remaining conductive bonding structures (431, 433). The heating laser 467 can have a wavelength that induces greater absorption of energy within the material of the conductive bonding structures (431, 432, 433) than within the materials of the support substrate 22G or within the materials of the devices to be transferred (e.g., the second LEDs 10G). The same heating laser can be employed as in the processing steps of FIG. 16B. The second conductive bonding structures 432 can be sequentially irradiated by a laser beam from the heating laser 467 to reflow each second conductive bonding structure 432, and to bond each second conductive bonding structure 432 to an overlying second LED 10G and to an underlying second bonding pad 422.

Figure 16H:
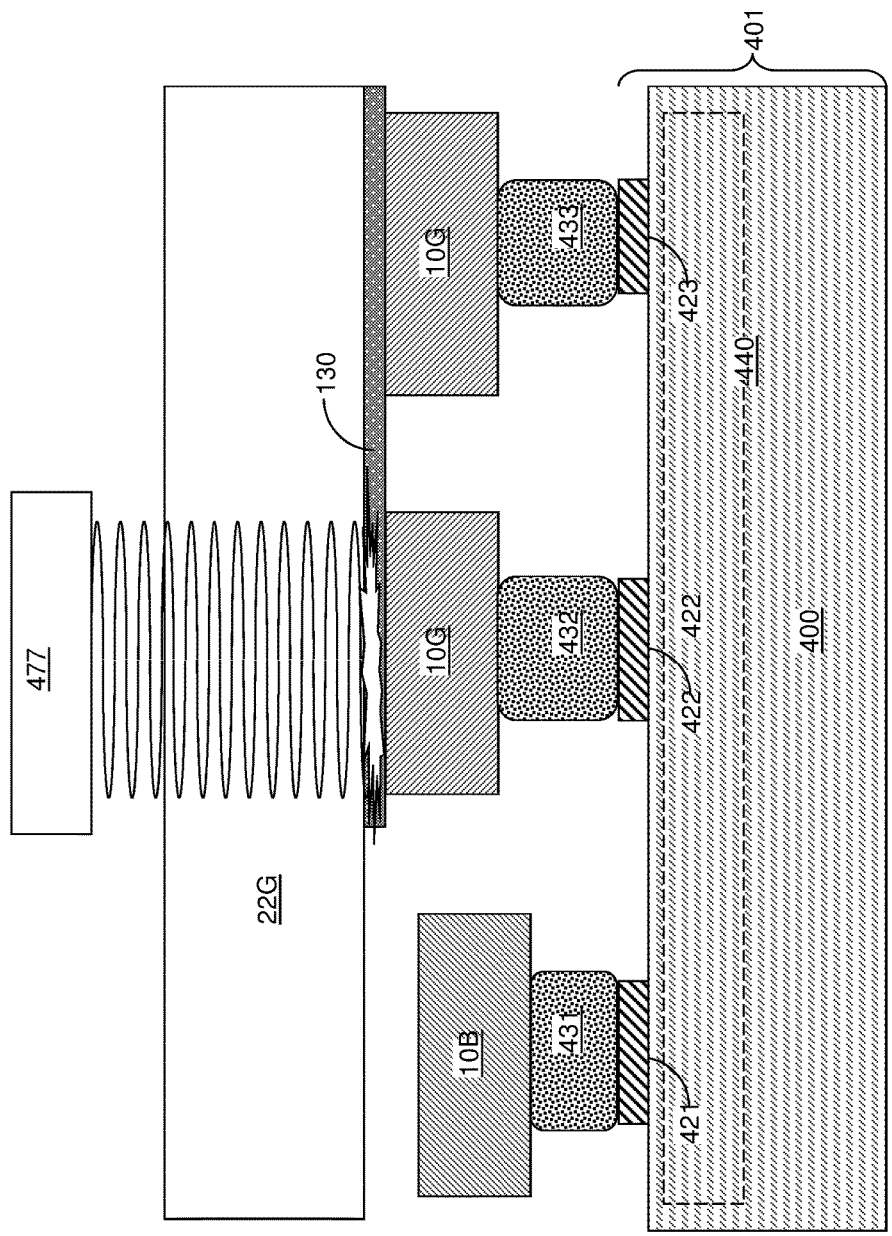

Referring to FIG. 16H, a laser irradiation process is performed to separate each bonded second LED 10G from the second support substrate. The wavelength of the laser 477 can be different from the wavelength of the heating laser 467, and provides more heating to the material of the ablation material layer 130 than to the materials of the support substrate 22G and the transferred devices (e.g., the second light emitting diodes 10G). Each portion of the ablation material layer 130 overlying the second conductive bonding structures 432 can be sequentially irradiated by a laser beam from the laser 477 to dissociate each underlying second LED 10G.

Figure 16I:
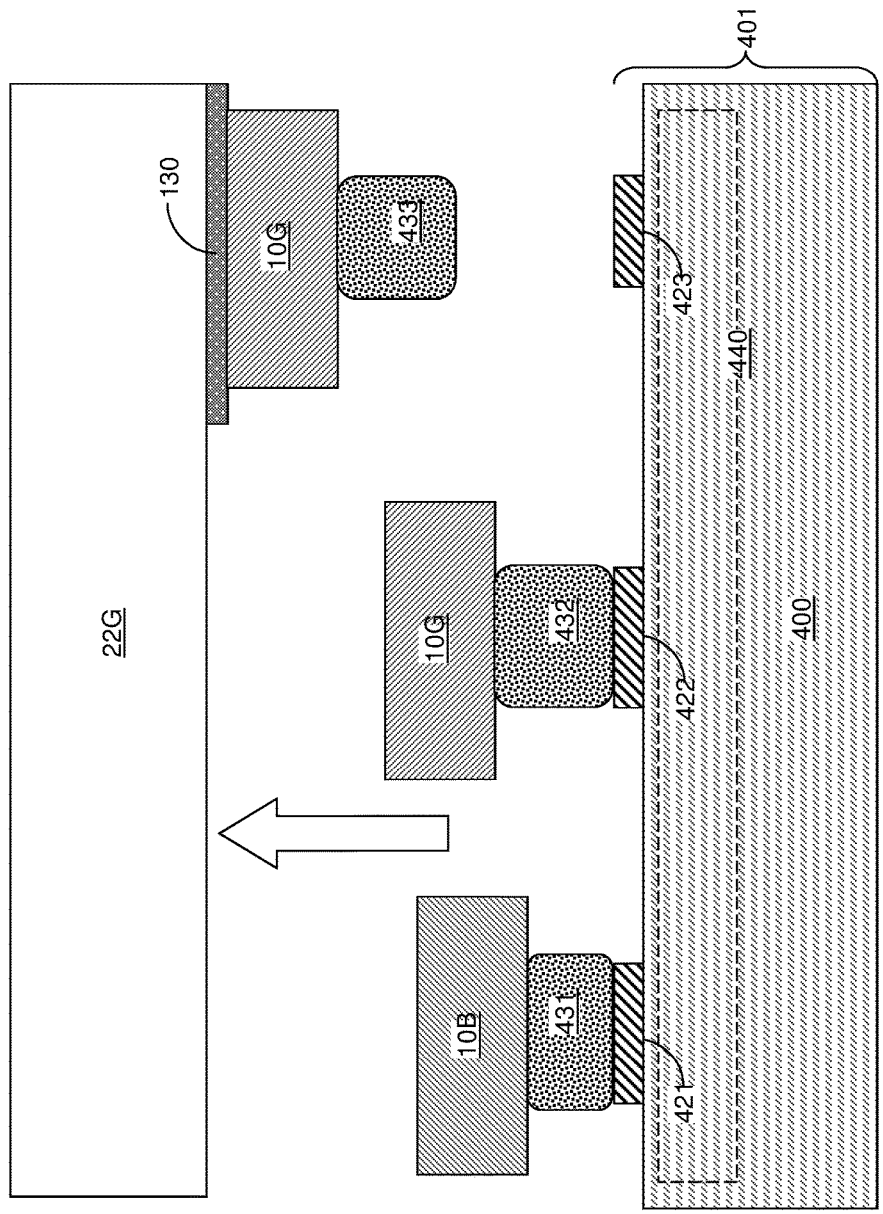

Referring to FIG. 16I, the assembly of the second support substrate 22G and attached second light emitting diodes 10G (a third subset of the second light emitting diodes 10G that remain on the second support substrate) is separated from the backplane 401 and the second subset of the second light emitting diodes 10G that are now attached to the backplane 401.

Figure 16J:
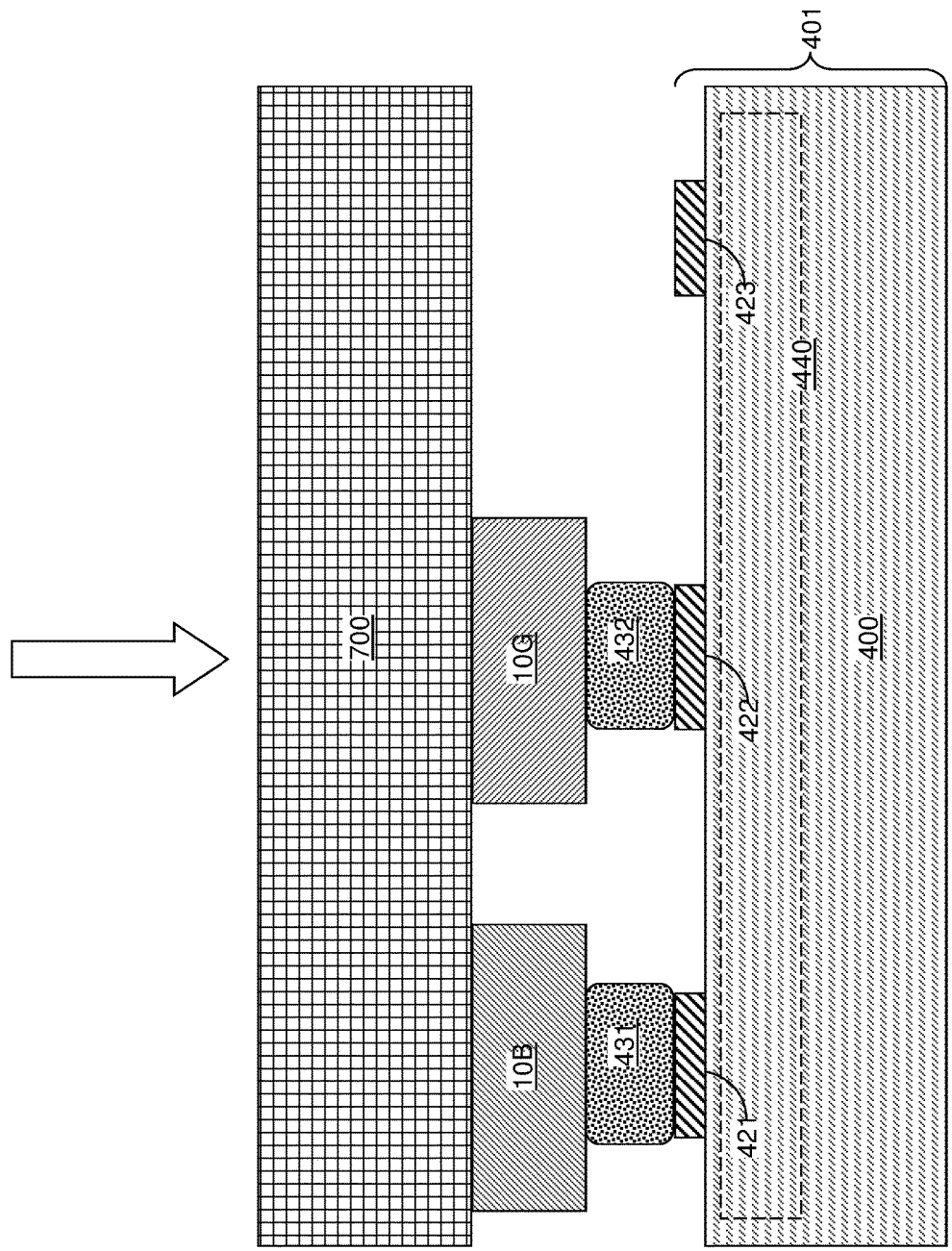

Referring to FIG. 16J, a dummy substrate 700 can employed to push the second light emitting diodes 10G on the second conductive bonding structures 432 toward the backplane 401 in the same manner as described above.

Figure 16K:
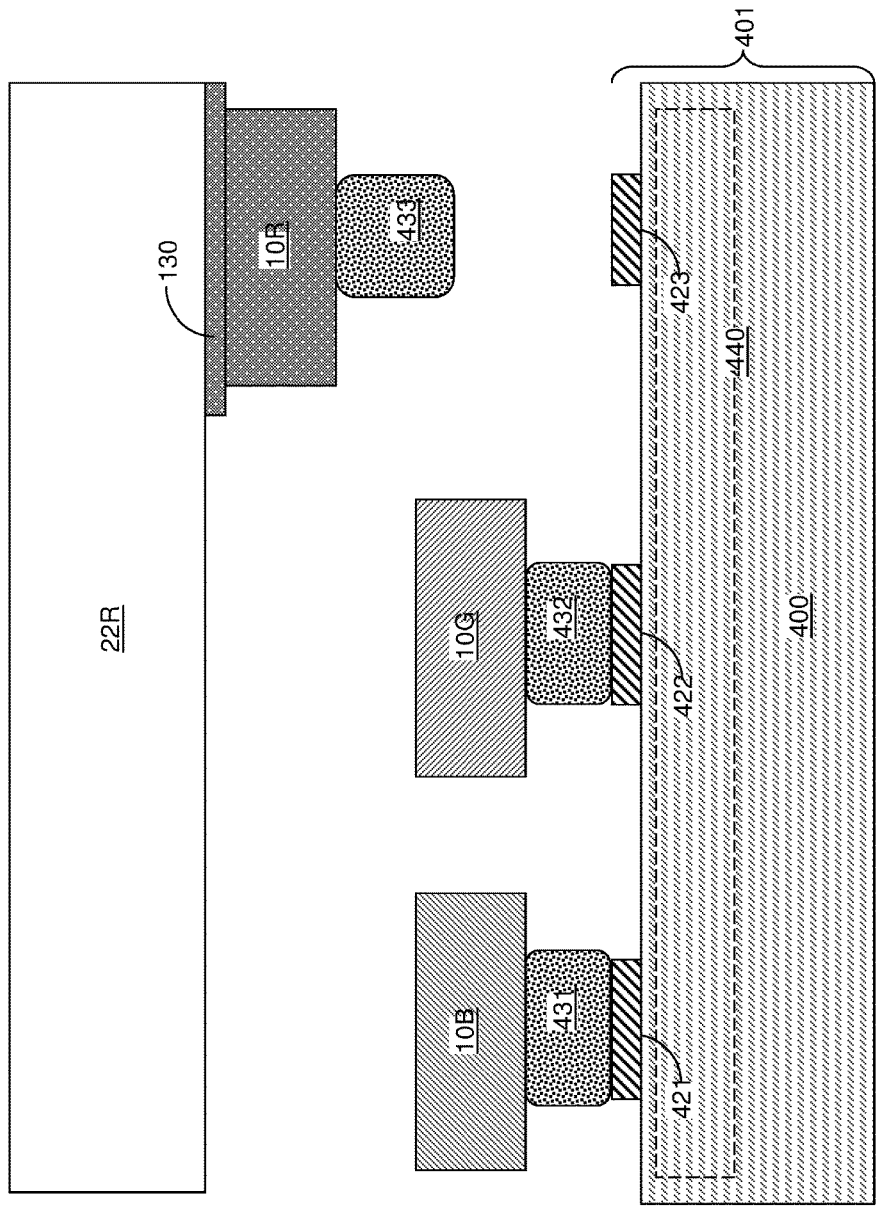

Referring to FIG. 16K, a third support substrate (such as a third transfer substrate 22R), from which a first subset and a second subset of third LEDs 10R have been removed in prior processing steps, is positioned over the in-process fourth exemplary light emitting device assembly, and is aligned such that a third subset of the third light emitting diodes 10R overlies the third bonding pads 423.

Figure 16L:
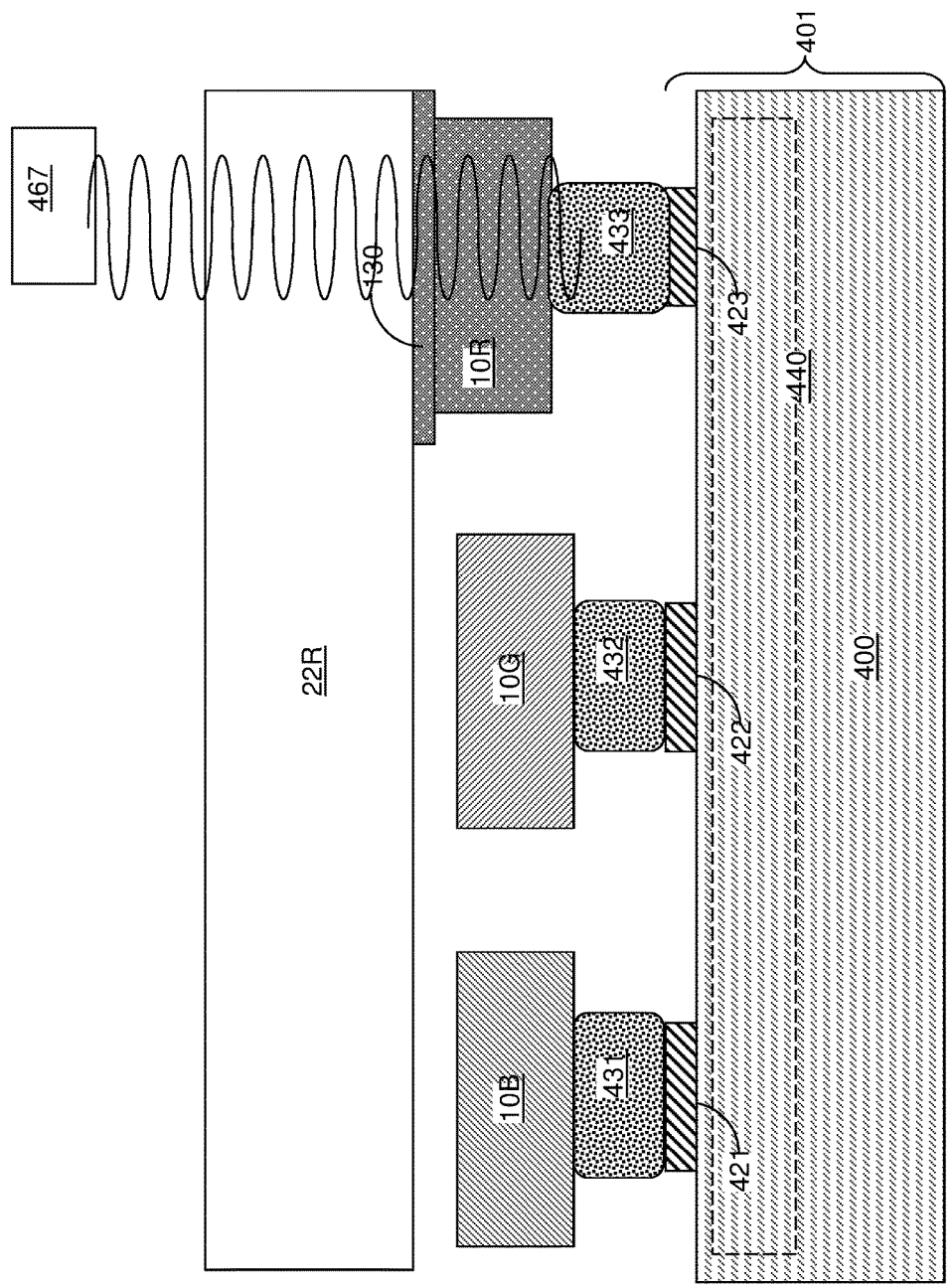

Referring to FIG. 16L, the backplane 401 and the assembly including the third light emitting diodes 10R are positioned such that each third conductive bonding structure 433 is attached a third LED 10R and contacts the third bonding pad 423. If any addition conductive bonding structures (not shown) are present, additional conductive bonding structures (not shown) overlying such additional bonding pads can contact underlying additional bonding pads and overlying third LEDs 10R, and can be attached to the underlying additional bonding pads or to the overlying third LEDs 10R.

A heating laser 467 is employed to reflow the third conductive bonding structures 433. The heating laser 467 can have a wavelength that induces greater absorption of energy within the material of the third conductive bonding structures 433 than within the materials of the support substrate 22R or within the materials of the devices to be transferred (e.g., the third LEDs 10R). The same heating laser can be employed as in the processing steps of FIG. 16B or FIG. 16G. The third conductive bonding structures 433 can be sequentially irradiated by a laser beam from the heating laser 467 to reflow each third conductive bonding structure 433, and to bond each third conductive bonding structure 433 to an overlying third LED 10R and to an underlying third bonding pad 423.

Figure 16M:
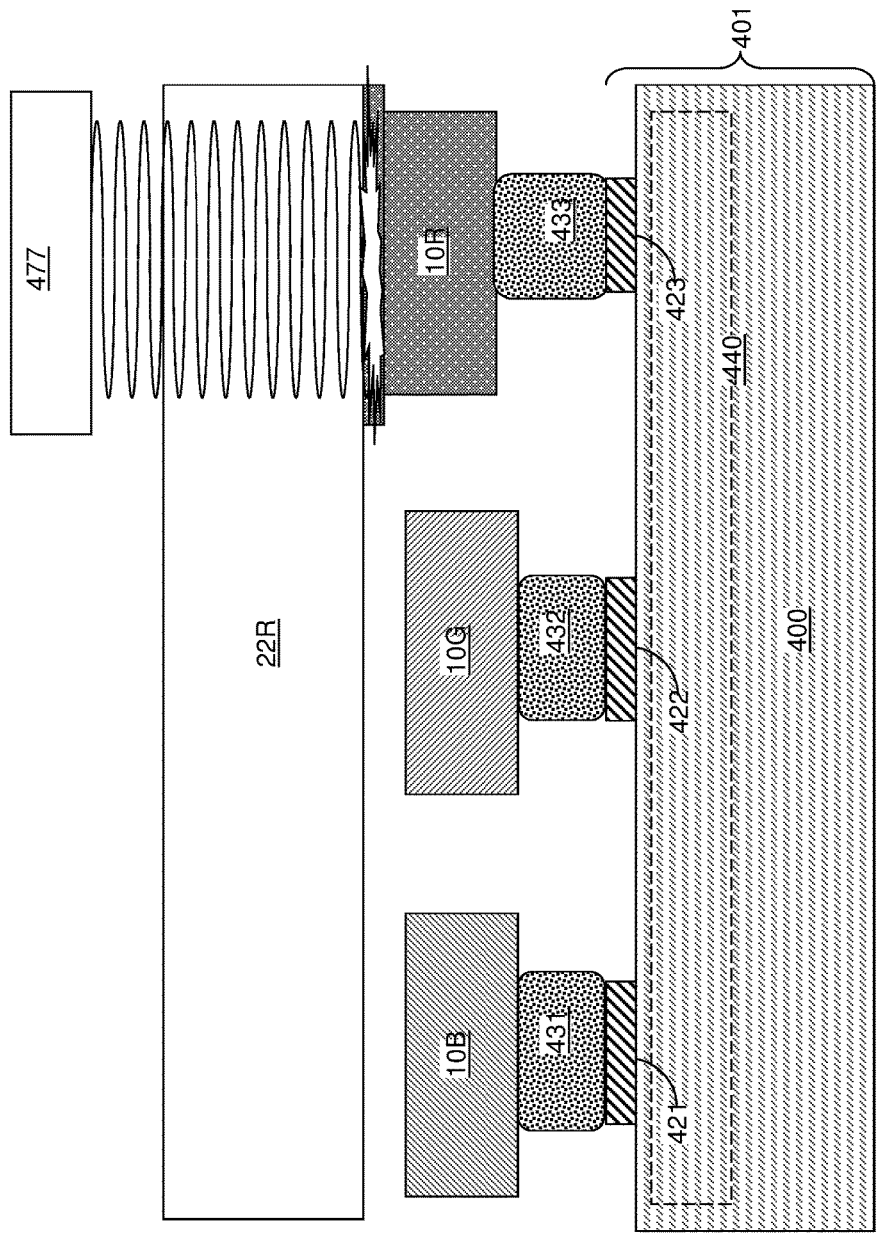

Referring to FIG. 16M, a laser irradiation process is performed to separate each bonded third LED 10R from the third support substrate in the same manner as in the processing steps of FIG. 15A.

Figure 16N:
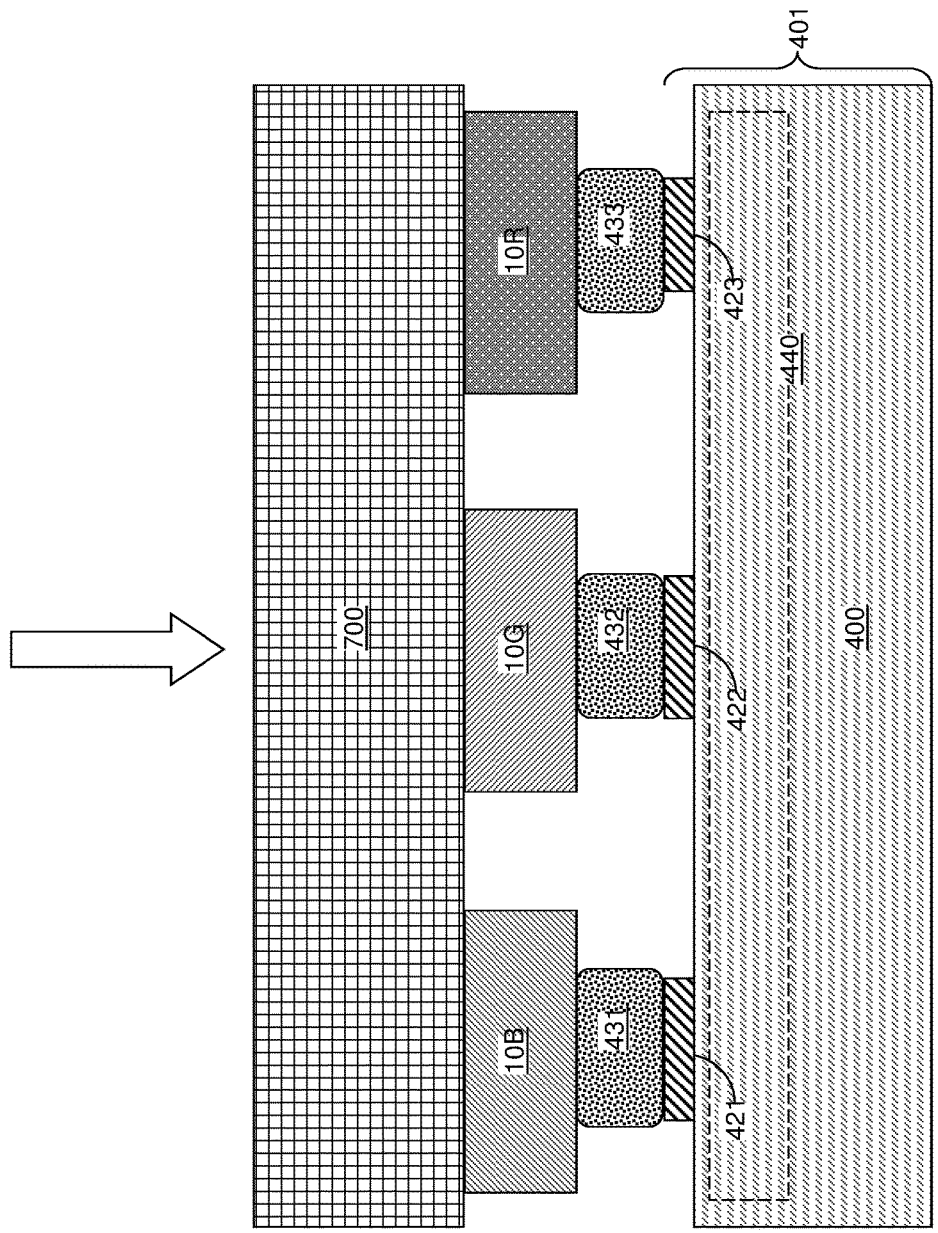

Referring to FIG. 16N, a dummy substrate 700 may be employed to push the third light emitting diodes 10R on the third conductive bonding structures 433 toward the backplane 401. The assembly of the third support substrate 22R and any remaining third light emitting diodes 10R, if any, is separated from the backplane 401 and the third subset of the third light emitting diodes 10R that are now attached to the backplane 401 in the same manner as above. The first, second and third LEDs (10B, 10G, 10R) attached to the backplane 401 have co-planar top and bottom surfaces (e.g., top surfaces which deviate by less than 0.25 microns (e.g., 0 to 0.2 microns) from a first common plane and bottom surfaces which deviate by less than 0.25 (e.g., 0 to 0.2 microns) microns from a second common plane due to the compressible conductive bonding structures.

Figure 16O:
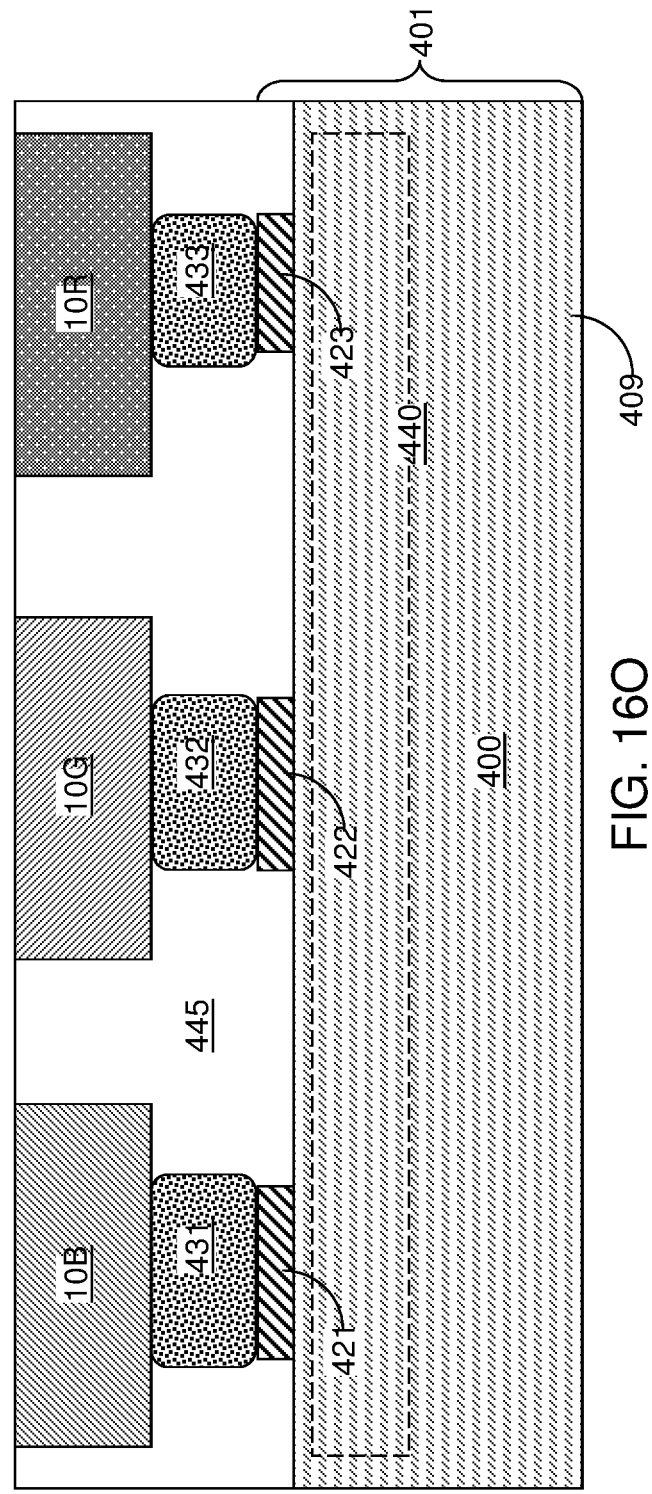

Referring to FIG. 16O, the dielectric matrix 445 illustrated in FIG. 15A can be applied in the spaces between the light emitting diode subpixels (10B, 10G, 10R) that are bonded to the backplane 401. While FIG. 16O illustrates only three subpixels (10B, 10G, 10R), it is understood that an array of pixels is formed on the backplane 401, and each pixel includes a set of light emitting diodes such as a blue-light emitting diode as a first LED subpixel 10B, a green-light emitting diode as a second LED subpixel 10G, and a red-light emitting diode as a third LED subpixel 10R. The dielectric matrix 445 can laterally surround each of the red-light emitting diodes, the green-light emitting diodes, and the blue light emitting diodes within the array of pixels. The dielectric matrix 445 can include a self-planarizing dielectric material such as spin-on glass (SOG) or polymer, or can be planarized by a recess etch or chemical mechanical planarization. The top surface of the dielectric matrix 445 as planarized can be within the horizontal plane including the top surfaces of the subpixels (10B. 10G, 10R), or can be vertically recessed below the horizontal plane including the top surfaces of the subpixels (10B. 10G, 10R).

Referring to FIG. 16P, a front side transparent conductive oxide layer 450 can be formed over the dielectric matrix 445 and directly on the electrical nodes that are located on top of each subpixel (10B, 10G, 10R). For example, the front side transparent conductive oxide layer 450 can be deposited on the semiconductor buffer layer 24 or directly on the compound semiconductor material layer 26 of the first conductivity type. For example, if the buffer layer 24 has a high resistivity and is not removed during the laser ablation step described above, then an additional etch back or CMP is performed to remove the buffer layer 24 and expose the doped compound semiconductor layer 26 of the first conductivity type.

In this case, the front side transparent conductive oxide layer 450 can be a common ground electrode for each of the red-light emitting diode subpixels 10R, the green-light emitting diode subpixels 10G, and the blue-light emitting diode subpixels 10B. The subpixels 10R, 10B, 10G form a pixel 125 of a direct view display device 500.

An optional transparent passivation dielectric layer 452 can be formed over the front side transparent conductive oxide layer 450. The transparent passivation dielectric layer 452 can include silicon nitride or silicon oxide. Thus, the LED subpixels 10B, 10G and 10R are so-called bottom emitting, vertical LEDs 10 which emit light through the compound semiconductor material layer 26, the front side transparent conductive oxide layer 450 and transparent passivation dielectric layer 452. The LEDs are vertical devices because they have electrical contacts (i.e., layer 450 and bonding structures or pads (431, 432, 433)) on opposite sides thereof.

According to one embodiment of the present disclosure, a light emitting device, such as the LED 10, comprises a substrate 20 including a doped compound semiconductor layer 26, a growth mask layer 42 located on a top surface of the doped compound semiconductor layer 26, a plurality of clusters 44 of semiconductor nanowires (32, 34) extending from a top surface of the doped compound semiconductor layer 26, and a second conductivity type semiconductor material layer 36 located within each cluster 44 of semiconductor nanowires and contacting sidewalls of each semiconductor nanowire within each cluster of semiconductor nanowires. The plurality of clusters 44 are separated by inter-cluster regions 45 that lack semiconductor nanowires (32, 34). Each semiconductor nanowire comprises nanowire core 32 of a first conductivity type extending through a respective opening 43 through the growth mask layer 42, and an active light emitting shell 34. Faceted sidewalls of the second conductivity type semiconductor material layer 36 adjoin a top surface of the growth mask layer 42 around a periphery of the second conductivity type semiconductor material layer 36, and the faceted sidewalls of the second conductivity type semiconductor material layer 36 include crystallographic p-planes.

Each cluster 44 of semiconductor nanowires (32, 34) and a portion second conductivity type semiconductor material layer 36 in each cluster 44 comprises a light emitting diode (LED) 10 which has a length of 1 to 5 microns parallel to a top surface of the doped compound semiconductor layer 26. The second conductivity type semiconductor material layer 36 is a continuous material layer within each cluster 44 of semiconductor nanowires and contacts all outer surfaces of the active light emitting shells 34 within each cluster 44 of semiconductor nanowires. However, the second conductivity type semiconductor material layer 36 is discontinuous between the clusters 44 of semiconductor nanowires and layer 36 is not present in the inter-cluster region 45.

The outer surfaces of the active light emitting shells 34 include vertical m-plane faceted surfaces that extend perpendicular to the top surface of the doped compound semiconductor layer 26, and tapered p-plane faceted surfaces located at a tip of each semiconductor nanowire and adjoined to an upper edge of a respective one of the vertical m-plane faceted surfaces.

Each of the faceted sidewalls of the second conductivity type semiconductor material layer 36 that adjoins the top surface of the growth mask layer 42 is at a same angle with respect a plane including the top surface of the growth mask layer 42. Each of the faceted sidewalls of the second conductivity type semiconductor material layer 36 extends within a respective two-dimensional plane from the top surface of the growth mask layer 42 to a location overlying a tip of a respective outermost semiconductor nanowire (32, 34) within the cluster 44 of semiconductor nanowires.

Generally, the exemplary LEDs 10 of the present disclosure can be employed to form a direct view display device 500 shown in FIG. 16P. In this case, a backplane 401 with bonding structures (421, 422, 423) can be employed. Each of the bonding structures (421, 422, 423) is electrically connected to a respective one of metal interconnect structures 440 located within, or on, the backplane 401. Multiple instances of the LED 10 are provided as subpixels. Each instance of the LED 10 can be bonded to a respective bonding structure (421, 422, 423) on the backplane 401. Each bonded instance of the LED subpixel emits light at a given peak wavelength for a respective pixel 125 of the direct view display device 500.

Thus, each LED 10 is electrically connected to a respective one of the metal interconnect structures 440 and constitutes a first subpixel (e.g., 10B) which emits light at a first peak wavelength (e.g., blue) of a respective pixel of the direct view display device. The respective pixel further comprises a second subpixel 10G comprising a second LED 10 which emits light at a second peak wavelength (e.g., green) different from the first peak wavelength, and a third subpixel 10R comprising a third LED 10 which emits light at a third peak wavelength (e.g., red) different from the first and the second peak wavelengths.

Each instance of the first LED subpixel 10B can be electrically connected to a respective one of the metal interconnect structures 440 and constitutes a subpixel which emits light at a first peak wavelength for a respective pixel. Multiple instances of a second LED subpixel 10G can be provided, which includes a same set of components as the first LED subpixel 10B with a modification that the active layer of the second LED subpixel 10G is configured to emit light at a second peak wavelength that is different from the first wavelength. Each instance of the second LED subpixel 10G is electrically connected to a respective one of the metal interconnect structures 440 and constitutes another subpixel for a respective pixel. Likewise, multiple instances of a third LED subpixel 10R can be provided, which includes a same set of components as the first LED subpixel 10B with a modification that the active layer of the third LED subpixel 10R is configured to emit light at a third peak wavelength that is different from the first wavelength and from the second wavelength. Each instance of the third LED subpixel 10R is electrically connected to a respective one of the metal interconnect structures 440 and constitutes yet another subpixel for a respective pixel. The direct view display device can be a multicolor direct view display device in which each pixel comprises a plurality of subpixels which emits light at different wavelengths (e.g., red, green and blue light).

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A light emitting device, comprising:
   a substrate including a doped compound semiconductor layer;
   a growth mask layer located on a top surface of the doped compound semiconductor layer;
   a plurality of clusters of semiconductor structures extending from the top surface of the doped compound semiconductor layer, wherein the plurality of clusters are separated by inter-cluster regions that lack semiconductor structures, and wherein each semiconductor structure comprises a core of a first conductivity type extending through a respective opening through the growth mask layer, and an active light emitting shell; and
   a second conductivity type semiconductor material layer located within each cluster of semiconductor structures and contacting sidewalls of each semiconductor structure within each cluster of semiconductor structures;
   a conductive reflector that is electrically shorted to the second conductivity type semiconductor material layer and including tapered sidewalls that are parallel to a respective one of the faceted sidewalls of the second conductivity type semiconductor material layer;
   a dielectric material layer including inner sidewalls that contact a respective one of the faceted sidewalls of the second conductivity type semiconductor material layer and outer sidewalls that contact inner tapered sidewalls of the conductive reflector;
   a conductive bonding structure overlying, and contacting, the conductive reflector, and comprising a solder material; and
   a transparent conductive oxide layer located on top of the second conductivity type semiconductor material layer and contacting a bottom surface of the conductive reflector;
   wherein faceted sidewalls of the second conductivity type semiconductor material layer adjoin a top surface of the growth mask layer around a periphery of the second conductivity type semiconductor material layer;
   wherein the faceted sidewalls of the second conductivity type semiconductor material layer include crystallographic p-planes; and
   wherein the semiconductor structures comprise semiconductor nanowires, and the core comprises a nanowire core.

2. The light emitting device of claim 1, wherein each cluster of semiconductor nanowires and a portion of the second conductivity type semiconductor material layer in each cluster comprises a light emitting diode (LED) which has a length of 1 to 5 microns parallel to the top surface of the doped compound semiconductor layer.

3. A direct view display device, comprising:
   a plurality of LEDs of claim 2; and
   a backplane comprising metal interconnect structures therein or thereupon;
   wherein:
   each LED is electrically connected to a respective one of the metal interconnect structures and constitutes a first subpixel which emits light at a first peak wavelength of a respective pixel of the direct view display device;
   the first sub-pixel is separated from adjacent subpixels on the substrate by the inter-cluster regions;
   the openings in the growth mask layer correspond to locations of the clusters of semiconductor nanostructures; and
   the inter-cluster regions lack the openings in the growth mask layer.

4. The direct view display device of claim 3, wherein the respective pixel further comprises:
   a second subpixel comprising a second LED which emits light at a second peak wavelength different from the first peak wavelength; and
   a third subpixel comprising a third LED which emits light at a third peak wavelength different from the first and the second peak wavelengths.

5. The light emitting device of claim 1, wherein:
   the second conductivity type semiconductor material layer is a continuous material layer within each cluster of semiconductor nanowires and contacts all outer surfaces of the active light emitting shells within each cluster of semiconductor nanowires;
   the second conductivity type semiconductor material layer is discontinuous between the clusters of semiconductor nanowires and is not present in the inter-cluster region; and
   wherein the outer surfaces of the active light emitting shells comprises:
   vertical m-plane faceted surfaces that extend perpendicular to the top surface of the doped compound semiconductor layer; and tapered p-plane faceted surfaces located at a tip of each semiconductor nanowire and adjoined to an upper edge of a respective one of the vertical m-plane faceted surfaces.

6. The light emitting device of claim 1, wherein each of the faceted sidewalls of the second conductivity type semiconductor material layer that adjoins the top surface of the growth mask layer is at a same angle with respect a plane including the top surface of the growth mask layer.

7. The light emitting device of claim 1, wherein:
   each of the faceted sidewalls of the second conductivity type semiconductor material layer extends within a respective two-dimensional plane from the top surface of the growth mask layer to a location overlying a tip of a respective outermost semiconductor nanowire within the cluster of semiconductor nanowires; and
   the faceted sidewalls of the second conductivity type semiconductor material layer at a periphery of each cluster consist of crystallographic p-planes.

8. The light emitting device of claim 1, wherein the second conductivity type semiconductor material layer comprises vertical seams at locations that are equidistant from outer sidewalls of a neighboring pair of active light emitting shells.

9. The light emitting device of claim 8, wherein the second conductivity type semiconductor material layer embeds cavities below the vertical seams between neighboring pairs of semiconductor nanowires in the clusters of semiconductor nanowires.

\* \* \* \* \*